US012140835B2

(12) United States Patent
Lin et al.

(10) Patent No.: US 12,140,835 B2
(45) Date of Patent: Nov. 12, 2024

(54) DISPLAY SUBSTRATE, DISPLAY PANEL, AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Jian Lin, Beijing (CN); Yong Zhang, Beijing (CN); Jian Wang, Beijing (CN); Wei Zhao, Beijing (CN); Gang Hua, Beijing (CN); Limin Zhang, Beijing (CN); Xianglei Qin, Beijing (CN); Zhichao Yang, Beijing (CN); Zepeng Sun, Beijing (CN); Yashuai An, Beijing (CN); Honggui Jin, Beijing (CN); Lingfang Nie, Beijing (CN); Zhilong Duan, Beijing (CN); Liangzhen Tang, Beijing (CN); Li Tian, Beijing (CN); Xinli Ma, Beijing (CN); Tianyu Xu, Beijing (CN); Bingyang Liu, Beijing (CN); Xueqiang Qian, Beijing (CN); Dongchuan Chen, Beijing (CN); Kaixuan Wang, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 59 days.

(21) Appl. No.: 17/594,437

(22) PCT Filed: Dec. 25, 2020

(86) PCT No.: PCT/CN2020/139569
§ 371 (c)(1),
(2) Date: Oct. 15, 2021

(87) PCT Pub. No.: WO2022/134054
PCT Pub. Date: Jun. 30, 2022

(65) Prior Publication Data
US 2022/0397793 A1 Dec. 15, 2022

(51) Int. Cl.
*G02F 1/1335* (2006.01)
*G02F 1/1333* (2006.01)
(Continued)

(52) U.S. Cl.
CPC .. *G02F 1/133553* (2013.01); *G02F 1/133345* (2013.01); *G02F 1/136286* (2013.01);
(Continued)

(58) Field of Classification Search
CPC .... G02F 1/13; G02F 1/1333; G02F 1/133345; G02F 1/1335; G02F 1/133553;
(Continued)

(56) References Cited

U.S. PATENT DOCUMENTS 5,691,791 A 11/1997 Nakamura et al.
6,313,895 B1 11/2001 Tsuda et al.
(Continued)

FOREIGN PATENT DOCUMENTS

CN 1188248 A 7/1998
CN 1281156 A 1/2001
(Continued)

OTHER PUBLICATIONS

First Office Action issued on Apr. 20, 2023 from CNIPA for Chinese patent application No. 202080003676.X and the English translation.

*Primary Examiner* — Thoi V Duong
(74) *Attorney, Agent, or Firm* — Kinney & Lange, P.A.

(57) ABSTRACT

The embodiments of the present disclosure provide a display substrate, a display panel, and a display device. The display
(Continued)

substrate includes: a first base substrate, wherein a plurality of sub-pixel regions arranged in an array are provided on the first base substrate; and a reflective layer provided on one side of the first base substrate, wherein a surface of the reflective layer away from the first base substrate is formed to include a plurality of first bumps and a plurality of second bumps, and the first bump has a size greater than that of the second bump.

19 Claims, 12 Drawing Sheets

(51) Int. Cl.
  *G02F 1/1343* (2006.01)
  *G02F 1/1362* (2006.01)
  *G02F 1/1368* (2006.01)
  *H01L 27/12* (2006.01)

(52) U.S. Cl.
  CPC ........ *G02F 1/1368* (2013.01); *H01L 27/1248* (2013.01); *H01L 27/124* (2013.01)

(58) Field of Classification Search
  CPC ................ G02F 1/1343; G02F 1/1362; G02F 1/136286; G02F 1/1368; H01L 27/124; H01L 27/1248
  See application file for complete search history.

(56) References Cited

U.S. PATENT DOCUMENTS

| | | | |
|---|---|---|---|
| 6,452,653 B1 | 9/2002 | Yamanaka et al. | |
| 7,085,036 B2 | 8/2006 | Otake et al. | |
| 7,106,495 B2 | 9/2006 | Otake et al. | |
| 7,157,739 B2 | 1/2007 | Nimura et al. | |
| 7,315,339 B2 | 1/2008 | Ryu | |
| 7,440,050 B2 | 10/2008 | Sumi | |
| 7,651,822 B2 | 1/2010 | Mizusako et al. | |
| 8,384,998 B2 | 2/2013 | Taguchi et al. | |
| 9,158,038 B2 | 10/2015 | Taguchi et al. | |
| 9,891,469 B2 | 2/2018 | Wang | |
| 2002/0018161 A1 | 2/2002 | Yamanaka et al. | |
| 2003/0011870 A1 | 1/2003 | Otake et al. | |
| 2004/0021812 A1 | 2/2004 | Liu | |
| 2004/0094764 A1 | 5/2004 | Nimura et al. | |
| 2006/0007530 A1 | 1/2006 | Otake et al. | |
| 2006/0139520 A1 | 6/2006 | Ryu | |
| 2006/0170845 A1 | 8/2006 | Lee | |
| 2006/0197891 A1* | 9/2006 | Chang | G02F 1/133553 349/113 |
| 2007/0091231 A1 | 4/2007 | Sumi | |
| 2007/0122718 A1 | 5/2007 | Mizusako et al. | |
| 2012/0069443 A1 | 3/2012 | Taguchi et al. | |
| 2012/0081793 A1 | 4/2012 | Taguchi et al. | |
| 2017/0038640 A1 | 2/2017 | Wang | |
| 2018/0145089 A1* | 5/2018 | Yu | G02F 1/134309 |
| 2022/0308390 A1* | 9/2022 | Zhang | G02F 1/133553 |

FOREIGN PATENT DOCUMENTS

| | | |
|---|---|---|
| CN | 1392443 A | 1/2003 |
| CN | 1497313 A | 5/2004 |
| CN | 1580890 A | 2/2005 |
| CN | 1794053 A | 6/2006 |
| CN | 1853117 A | 10/2006 |
| CN | 1975569 A | 6/2007 |
| CN | 102460227 A | 5/2012 |
| CN | 104280942 A | 1/2015 |
| CN | 104991377 A | 10/2015 |
| EP | 586220 A1 | 3/1994 |
| JP | 2000193968 A | 7/2000 |

\* cited by examiner

DISPLAY SUBSTRATE, DISPLAY PANEL, AND DISPLAY DEVICE

CROSS REFERENCE TO RELATED APPLICATION(S)

This application is a Section 371 National Stage Application of International Application No. PCT/CN2020/139569, filed on Dec. 25, 2020, entitled "DISPLAY SUBSTRATE, DISPLAY PANEL, AND DISPLAY DEVICE", which is incorporated herein by reference in its entirety.

TECHNICAL FIELD

The present disclosure relates to a field of display technology, and in particular to a display substrate, a display panel and a display device.

BACKGROUND

Reflective liquid crystal display (LCD) technology is implemented to use a reflective layer to reflect light incident on a display substrate, and the reflected light reaches observer's eyes after passing through a liquid crystal, thereby achieving a picture display. Reflective LCD technology may reduce a reliance on backlight, so that power consumption may be significantly reduced. Generally, the reflective layer has poor diffuse reflectivity to incident light, which affects a uniformity of a picture.

SUMMARY

Embodiments of the present disclosure provide a display substrate, including:

a first base substrate, wherein a plurality of sub-pixel regions arranged in an array are provided on the first base substrate; and a reflective layer provided on one side of the first base substrate, wherein a surface of the reflective layer away from the first base substrate is formed to include a plurality of first bumps and a plurality of second bumps, and the first bump has a size greater than that of the second bump.

For example, the plurality of first bumps and the plurality of second bumps are alternately arranged in at least one of a first direction and a second direction, the size of the first bump is 4 to 6 times the size of the second bump, the first direction is a row direction of the array, and the second direction is a column direction of the array.

For example, the plurality of first bumps are arranged in a third direction, and at least two adjacent first bumps in the third direction have different sizes; and/or the plurality of first bumps are arranged in a fourth direction, and at least two adjacent first bumps in the fourth direction have different sizes, wherein any two of the first direction, the second direction, the third direction and the fourth direction intersect each other.

For example, each of the first bump and the second bump has a height within a range of 1.05 μm±δ, the height is a distance between a top of the bump and a bottom of the bump, and δ is a tolerance value of height error.

For example, each of the first bump and the second bump has a slope within a range of 6 degrees to 12 degrees.

For example, each sub-pixel region is provided with at least one pixel electrode, the reflective layer is located on a side of the pixel electrode away from the first base substrate or a side of the pixel electrode close to the first base substrate, the reflective layer is a continuous layer, and a projection of the reflective layer on the first base substrate covers projections of the pixel electrodes in the plurality of sub-pixel regions on the first base substrate.

For example, in each sub-pixel region at least one pixel electrode is provided, the reflective layer is formed of a conductive material, the reflective layer includes a plurality of reflective parts insulated from each other, and at least one of the plurality of reflective parts is multiplexed as one of the plurality of pixel electrodes in a sub-pixel region.

For example, the display substrate further includes an insulating layer provided on a side of the reflective layer facing the first base substrate, a surface of the insulating layer away from the first base substrate is formed to include a plurality of bumps, and the reflective layer is conformally formed on a side of the insulating layer away from the first base substrate, so that the reflective layer is formed to include the plurality of first bumps and the plurality of second bumps.

For example, in each sub-pixel region, at least one transistor connected to the pixel electrode is further provided, the transistor includes a gate electrode, a first electrode and a second electrode, and the second electrode is electrically connected to the reflective part multiplexed as the pixel electrode in the sub-pixel region.

For example, the insulating layer is a continuous layer.

For example, the insulating layer includes a plurality of first insulating regions and a plurality of second insulating regions, the plurality of first insulating regions and the plurality of second insulating regions are alternately arranged in the second direction, a density of bumps in the first insulating region is greater than a density of bumps in the second insulating region, and the second direction is the column direction of the array.

For example, the insulating layer is a resin layer.

For example, the display substrate further includes a passivation layer provided on the side of the insulating layer away from the first base substrate.

For example, the passivation layer is made of silicon nitride and has a thickness within a range of 0.1 μm to 0.2 μm.

For example, the display substrate further includes:

a plurality of gate lines extending in the first direction, wherein the plurality of gate lines are arranged in the same layer as the gate electrode of the transistor, each gate line is electrically connected to the gate electrodes of the transistors in at least one row of sub-pixel regions in the array, and the first direction is the row direction of the array; and a plurality of data lines extending in the second direction, wherein the plurality of data lines are arranged in the same layer as the first electrode and the second electrode of the transistors, each data line is electrically connected to the first electrodes of the transistors in at least one column of sub-pixel regions in the array, and the second direction is the column direction of the array;

wherein the plurality of gate lines and the plurality of data lines intersect to define the plurality of sub-pixel regions; each of the transistor in at least one sub-pixel region, at least a part of the gate line electrically connected to the transistor in the sub-pixel region and at least a part of the data line electrically connected to the transistor in the sub-pixel region has a projection on the first base substrate being located within a projection of the reflective part electrically connected to the transistor in the sub-pixel region on the first base substrate.

For example, in each sub-pixel region a first common electrode is further provided;

the display substrate further includes a plurality of common electrode lines extending in the first direction and arranged in the same layer as the gate electrode of the transistor, and at least one common electrode line is electrically connected to the first common electrode in at least one row of sub-pixel regions in the array; and each of the first common electrode in each sub-pixel region and at least a part of the common electrode line electrically connected to the first common electrode has a projection on the first base substrate being located within a projection of the reflective part multiplexed as the pixel electrodes in the sub-pixel region on the first base substrate.

For example, the reflective part includes a first reflective region and a second reflective region, and the reflective part has a surface being flat in the first reflective region and including the first bumps and the second bumps in the second reflective region.

For example, a projection of the first reflective region on the first base substrate covers a projection of at least a part of the transistor on the first base substrate.

For example, the display substrate further includes at least one spacer, and a projection of the first reflective region on the first base substrate at least partially overlaps a projection of the spacer on the first base substrate.

For example, a via hole is provided in the insulating layer, and the reflective part is electrically connected to the second electrode of the transistor through the via hole.

For example, each reflective part is electrically connected to the second electrode of the transistor in the sub-pixel region through at least two via holes arranged in a fifth direction, and an angle of the fifth direction with respect to the first direction is within a range of 15 degrees to 45 degrees.

For example, a projection of each of the first bumps and the second bumps on the first base substrate has a shape of circle or ellipse.

For example, the reflective layer further includes a third bump, a fourth bump, a fifth bump and a sixth bump randomly arranged and having different sizes with each other, and each of the first bump, the second bump, the third bump, the fourth bump, the fifth bump and the sixth bump has a size within a range of 13 µm to 18 µm.

For example, the reflective layer further includes a third bump, the first bump, the second bump and the third bump are randomly arranged and have different sizes with each other, and each of the first bump, the second bump and the third bump has a size within a range of 16 µm to 18 µm.

The embodiments of the present disclosure further provide a mask including a plurality of light-transmitting regions and an opaque region located between the light-transmitting regions, and the plurality of light-transmitting regions have at least three sizes.

For example, the mask includes a plurality of mask regions arranged in an array, and each mask region includes a first group of light-transmitting regions and a second group of light-transmitting regions;

the first group of light-transmitting regions includes a first light-transmitting region, a second light-transmitting region, a third light-transmitting region, a fourth light-transmitting region and a fifth light-transmitting region, each of the first light-transmitting region and the third light-transmitting region has a first size, each of the second light-transmitting region and the fourth light-transmitting region has a second size, and the fifth light-transmitting region has a third size; and the second group of light-transmitting regions includes the fourth light-transmitting region, the fifth light-transmitting region, a sixth light-transmitting region, a seventh light-transmitting region and an eighth light-transmitting region, each of the sixth light-transmitting region and the seventh light-transmitting region has a fourth size, and the eighth light-transmitting region has the third size.

For example, a geometric center of the first light-transmitting region, a geometric center of the second light-transmitting region, a geometric center of the third light-transmitting region and a geometric center of the fourth light-transmitting region are arranged to form a first rectangle, the first light-transmitting region is located at a first vertex of the first rectangle, the second light-transmitting region is located at a second vertex of the first rectangle, the third light-transmitting region is located at a third vertex of the first rectangle, the fourth light-transmitting region is located at a fourth vertex of the first rectangle, and the fifth light-transmitting region is located within the first rectangle, wherein the first vertex and the third vertex of the first rectangle are diagonal vertices, and the second vertex and the fourth vertex of the first rectangle are diagonal vertices; and a geometric center of the fifth light-transmitting region, a geometric center of the sixth light-transmitting region, a geometric center of the seventh light-transmitting region and a geometric center of the eighth light-transmitting region are arranged to form a second rectangle, the sixth light-transmitting region is located at a first vertex of the second rectangle, the fifth light-transmitting region is located at a second vertex of the second rectangle, the seventh light-transmitting region is located at a third vertex of the second rectangle, the eighth light-transmitting region is located at a fourth vertex of the second rectangle, and the fourth light-transmitting region is located within the second rectangle, wherein the first vertex and the third vertex of the second rectangle are diagonal vertices, and the second vertex and the fourth vertex of the second rectangle are diagonal vertices.

For example, the first group of light-transmitting regions further includes a ninth light-transmitting region, a tenth light-transmitting region, an eleventh light-transmitting region and a twelfth light-transmitting region, the ninth light-transmitting region is located between the first light-transmitting region and the second light-transmitting region, the tenth light-transmitting region is located between the second light-transmitting region and the third light-transmitting region, the eleventh light-transmitting region is located between the third light-transmitting region and the fourth light-transmitting region, and the twelfth light-transmitting region is located between the fourth light-transmitting region and the first light-transmitting region;

the second group of light-transmitting regions further includes the eleventh light-transmitting region, the twelfth light-transmitting region, a thirteenth light-transmitting region and a fourteenth light-transmitting region, the eleventh light-transmitting region is located between the fifth light-transmitting region and the seventh light-transmitting region, the twelfth light-transmitting region is located between the fifth light-transmitting region and the sixth light-transmitting region, the thirteenth light-transmitting region is located between the seventh light-transmitting region and the eighth light-transmitting region, the fourteenth light-transmitting region is located between the eighth light-transmitting region and the sixth light-transmitting region; and each of the ninth light-transmitting region, the tenth light-transmitting region, the eleventh light-transmitting region, the twelfth light-transmitting region, the thirteenth light-transmitting region and the fourteenth light-transmitting region has a fifth size less than each of the first size, the second size, the third size and the fourth size.

The embodiments of the present disclosure further provide a display panel, including a first substrate, a second substrate, and a liquid crystal located between the first substrate and the second substrate, wherein the first substrate is implemented by the display substrate described above.

For example, the second substrate includes:

a second base substrate; and a second common electrode arranged on a side of the second base substrate facing the first substrate.

For example, a first alignment layer is further provided on a side of the first substrate facing the second substrate, and the second substrate further includes:

a polarizer provided on a side of the second base substrate away from the first substrate;

a color filter layer provided on a side of the second base substrate facing the first substrate;

a second common electrode provided on a side of the color filter layer facing the first substrate; and a second alignment layer provided on a side of the second common electrode facing the first substrate.

The embodiments of the present disclosure further provide a display device, including:

the display panel described above; and a front light source provided on a side of the second substrate of the display panel away from the first substrate and configured to emit light toward the second substrate.

DETAILED DESCRIPTION OF EMBODIMENTS

Although the present disclosure will be fully described with reference to the drawings containing the preferred embodiments of the present disclosure, it should be understood that those skilled in the art may modify the present disclosure while obtaining the technical effects of the present disclosure. Therefore, it should be understood that the above description is a broad disclosure for those ordinary skilled in the art, and its content is not intended to limit the exemplary embodiments described in the present disclosure.

In addition, in the following detailed description, for the convenience of explanation, many specific details are set forth to provide a comprehensive understanding of the embodiments of the present disclosure. Obviously, however, one or more embodiments may also be implemented without these specific details. In other cases, well-known structures and devices are shown in diagrammatic form to simplify the drawings.

Figure 1:
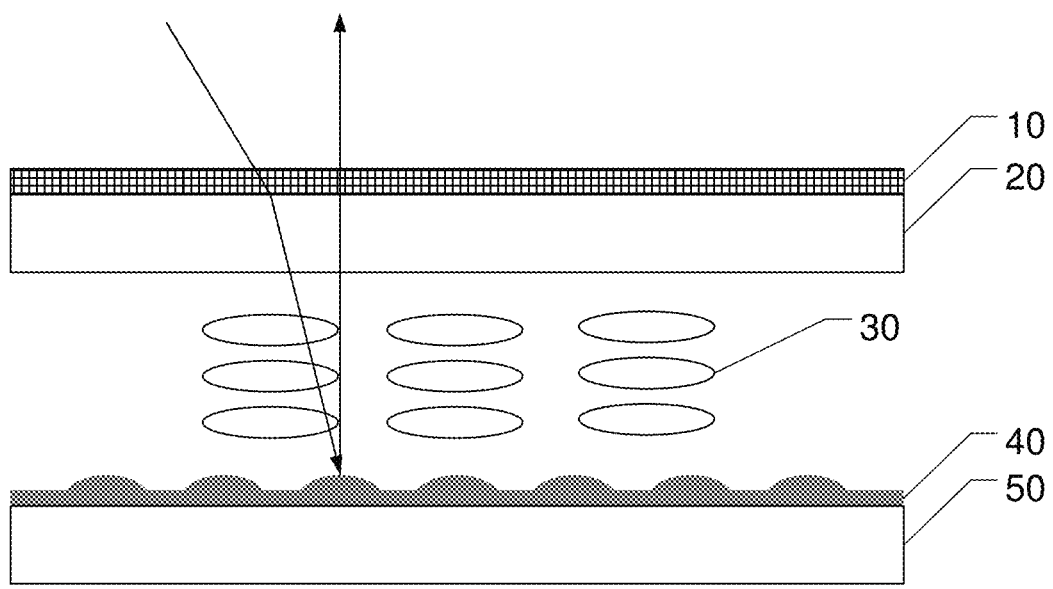
FIG. 1 shows a principle diagram of a reflective liquid crystal display technology.

FIG. 1 shows a principle diagram of a reflective liquid crystal display technology. As shown in FIG. 1, external light passes through a polarizer 10, a color filter base substrate 20 and a liquid crystal 30 to reach an array base substrate 40. A reflective layer 50 is provided on a side of the array base substrate 40 facing the color filter base substrate 20, and a surface of the reflective layer 50 includes a plurality of bumps or depressions, so that incident light in the same direction may be reflected by the reflective layer 50 in different directions (as shown by arrows in FIG. 1). The reflected light passes through the liquid crystal 30, the color filter base substrate 20 and the polarizer 10 and reaches observer's eyes, so that the observer can see a picture. Generally, the bumps on the surface of the reflective layer 50 have the same structure and are arranged periodically, which results in differences in reflectivity under different viewing angles, so that the uniformity of display under different viewing angles is affected. In addition, because the bumps have the same structure and are arranged periodically, a grating is formed, so that color rings similar to moires may appear in actual use.

The embodiments of the present disclosure provide a display substrate, a display panel, and a display device. By arranging a plurality of first bumps and a plurality of second bumps with different sizes in the reflective layer, an irregularity of the bumps on the surface of the reflective layer is improved, so that a diffuse reflectivity to the incident light may be improved, and a display effect may be improved.

Figure 2:
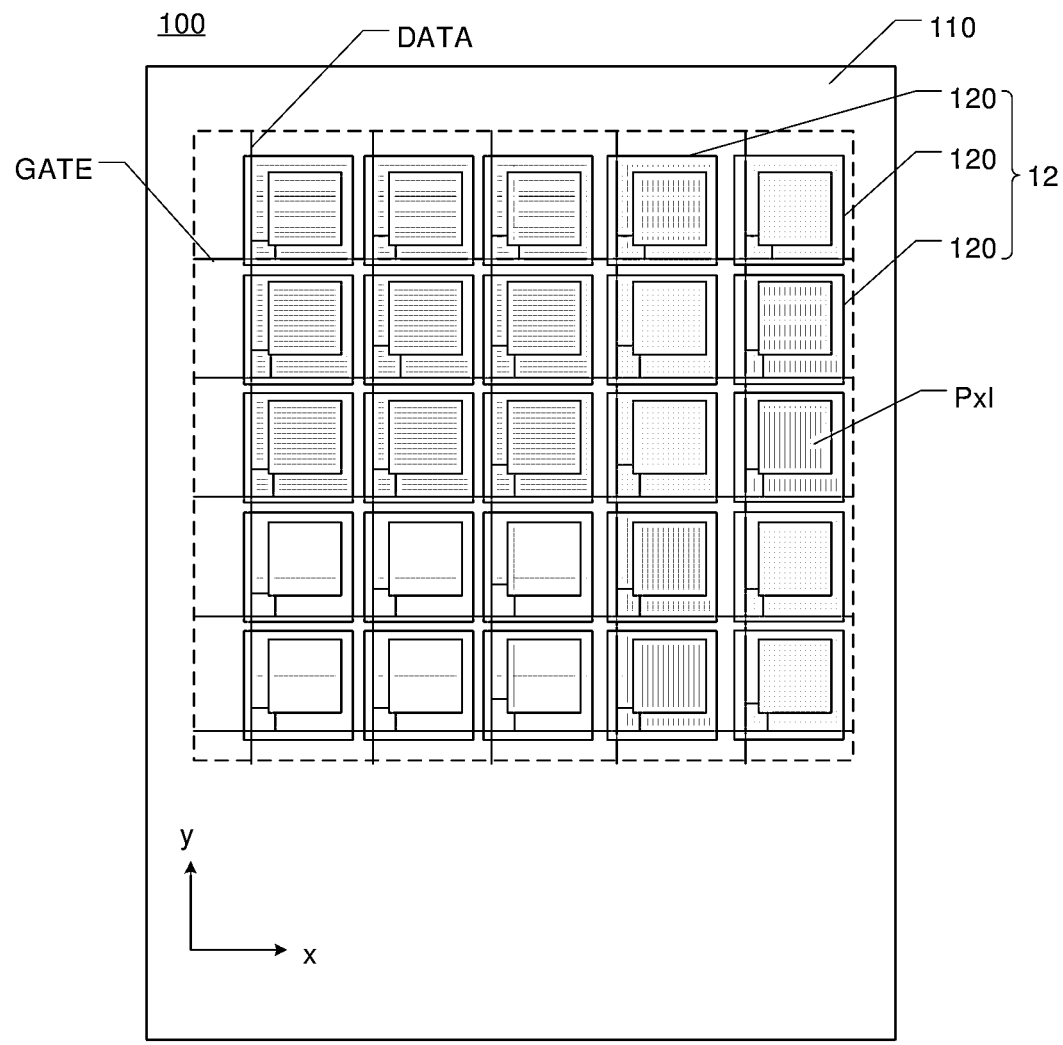
FIG. 2 shows a schematic plan view of a display substrate according to the embodiments of the present disclosure.

FIG. 2 shows a schematic plan view of a display substrate according to the embodiments of the present disclosure.

As shown in FIG. 2, a display substrate 100 includes a base substrate 110. A plurality of gate lines GATE and a plurality of data lines DATA are provided on the base substrate 110. The plurality of gate lines GATE extend in a first direction (x-direction in FIG. 2), and the plurality of data lines DATA extend in a second direction (y-direction in FIG. 2) different from the x-direction. The plurality of gate lines GATE and the plurality of data lines DATA intersect to define a plurality of sub-pixel regions Pxl, and each sub-pixel region Pxl is provided with a pixel electrode and at least one transistor (for example, a thin film transistor) electrically connected to the pixel electrode. Each gate line GATE is electrically connected to at least one transistor in at least one sub-pixel region Pxl, and each data line DATA is electrically connected to at least one transistor in at least one sub-pixel region Pxl. At least one transistor in a sub-pixel region Pxl is turned on under the control of a gate driving signal at the gate line GATE connected to the at least one transistor, so that a data signal at the data line DATA connected to the at least one transistor is input to the pixel electrode in the sub-pixel region Pxl for display. In FIG. 2, the base substrate 110 includes a display region (as shown by a dashed frame in FIG. 2) and a peripheral region located at a periphery of the display region. One or more of the sub-pixel regions Pxl described above are located in the display region and are led out from the display region through the gate line GATE and the data line DATA.

As shown in FIG. 2, the display substrate 100 may further include a reflective layer 12. In some embodiments, the reflective layer 12 may be implemented as a block structure including a plurality of reflective parts insulated from each other, and each reflective part corresponds to one or more sub-pixels. For example, in FIG. 2, the reflective layer 12 is formed of a conductive material and includes a plurality of reflective parts 120 insulated from each other. At least one reflective part 120 is multiplexed as a pixel electrode in a sub-pixel region Pxl. In FIG. 2, the plurality of reflective parts 120 are arranged on one side of the first base substrate 110 and correspond to the plurality of sub-pixel regions Pxl one-to-one. The transistor in each sub-pixel region Pxl may be electrically connected to the reflective part 120 corresponding to the sub-pixel region Pxl, so that the reflective part 120 is multiplexed as the pixel electrode in the sub-pixel region. However, the embodiments of the present disclosure are not limited thereto, and the reflective layer 12 may be provided in other forms as required. For example, in some embodiments, the reflective layer 120 may not be multiplexed as the pixel electrode, but as a separate layer for reflection. In this case, the reflective layer 12 may be located on a side of the pixel electrode in the sub-pixel region Pxl away from the first base substrate or a side of the pixel electrode in the sub-pixel region Pxl close to the first base substrate, and the reflective layer 12 may be a continuous layer. The so-called continuous may mean that the reflective layer 12 is an integral structure without separate parts. The reflective layer 12 may also be implemented as a block structure including a plurality of reflective parts, and each reflective part may correspond to one or more sub-pixel regions Pxl. For example, a projection of the reflective layer 12 on the first base substrate may cover a projection of the pixel electrodes of a plurality of sub-pixel regions Pxl on the first base substrate.

According to the embodiments of the present disclosure, the surface of the reflective layer 12 away from the first base substrate 110 may be formed to include a plurality of first bumps and a plurality of second bumps, and the first bump has a size greater than that of the second bump. A layout of these bumps will be described below with reference to FIG. 3 to FIG. 5.

Figure 3:
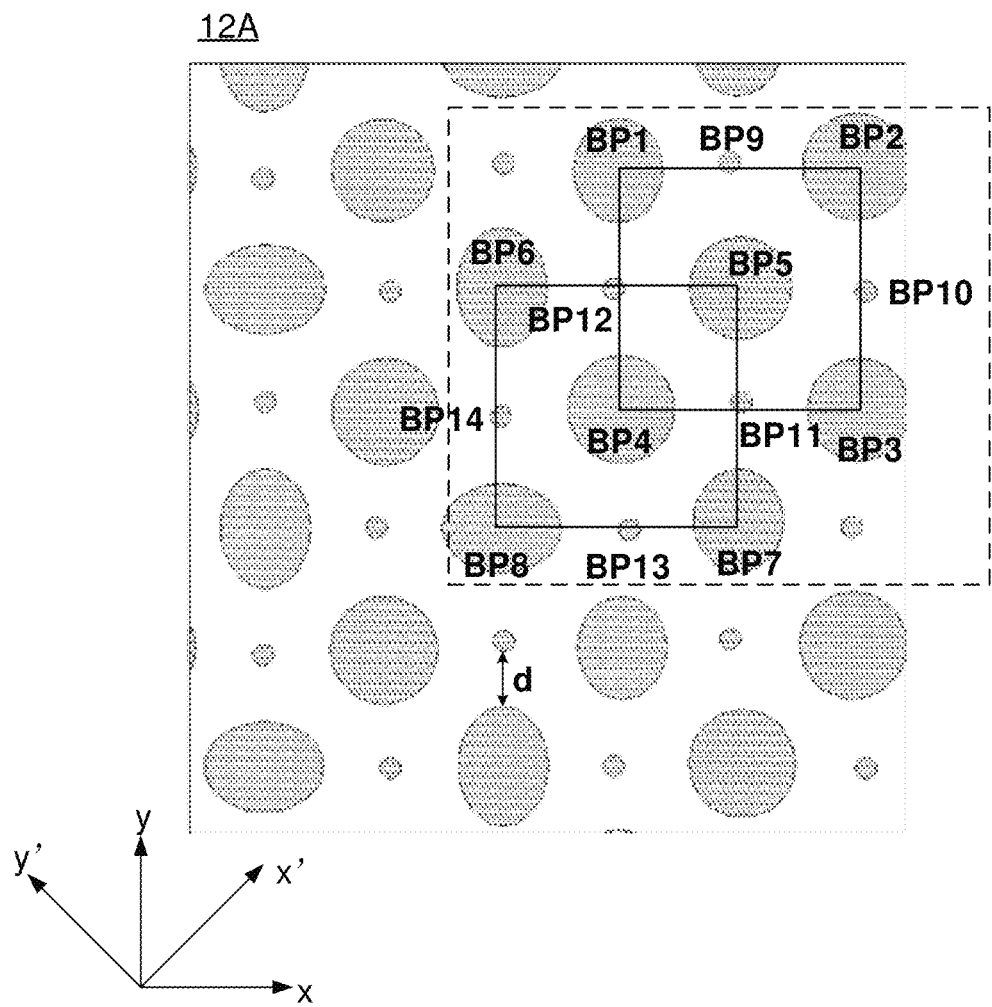
FIG. 3 shows a layout diagram of bumps of a reflective layer according to an embodiment of the present disclosure.

FIG. 3 shows a layout diagram of the bumps of the reflective layer according to an embodiment of the present disclosure. As shown in FIG. 3, the surface of the reflective layer 12A include a plurality of first bumps and a plurality of second bumps. For ease of description, only eight first bumps BP1 to BP8 and six second bumps BP9 to BP14 (hereinafter also collectively referred to as bumps BP) within the dashed frame are marked in FIG. 3.

As shown in FIG. 3, the first bumps BP1 to BP8 and the second bumps BP9 to BP14 are alternately arranged in at least one of the first direction (x-direction) and the second direction (y-direction). For example, in the x-direction, the first bumps BP3 and BP4 and the second bumps BP11 and BP14 are alternately arranged, and the first bumps BP5 and BP6 and the second bumps BP10 and BP12 are alternately arranged; in the y-direction, the first bumps BP1 and BP4 and the second bumps BP12 and BP13 are alternately arranged, the first bumps BP5 and BP7 and the second bumps BP9 and BP11 are alternately arranged, and so on. In some embodiments, as shown in FIG. 3, the first bumps BP1 to BP8 are arranged in a third direction (x'-direction) and/or a fourth direction (y'-direction). Any two of the first direction, the second direction, the third direction and the fourth direction intersect each other. For example, the x-direction may be a row direction of the array of the sub-pixel regions, the y-direction may be a column direction of the array of the sub-pixel regions, an angle of the x'-direction with respect to the x-direction may be within a range of 30 degrees to 50 degrees, such as 45 degrees, and the y'-direction may be substantially perpendicular to the x'-direction.

The size of the first bumps BP1 to BP8 may be 4 to 6 times the size of the second bumps BP9 to BP12. For example, the size of each of the first bumps BP1 to BP8 may be in a range of 5 μm to 10 μm and the size of each of the second bumps BP9 to BP14 may be in a range of 1 μm to 2 μm. Here, the size of the bump may refer to a size of a projection of the bump on the first base substrate. In FIG. 3, the projection of each of the first bumps BP1 to BP8 on the first base substrate may be randomly an ellipse or a circle, and the projection of each of the second bumps BP9 to BP14 on the first base substrate is substantially a circle. The size of the bump having an elliptical projection may be represented by a length of a major axis or a length of a minor axis of the ellipse, or by an average value of the length of the major axis and the length of the minor axis; the size of the bump having a circular projection may be represented by a diameter of the circle. Certainly, the embodiments of the present disclosure are not limited to this. The first bump and the second bump may have any other shapes as required, such as a polygon, a rectangle, a triangle, or even an irregular shape.

In some embodiments, at least two adjacent first bumps in the third direction and/or the fourth direction of the first bumps BP1 to BP8 have different sizes. For example, each of the first bumps BP1 and BP3 has a size in a range of 8 μm±α, each of the first bumps BP2 and BP4 has a size in a range of 7 μm±α, each of the first bumps BP5 and BP8 has a size in a range of 9 μm±α, and each of the first bumps BP6 and BP7 has a size in a range of 6 μm±α, where α is a first tolerance value of error. Each of the second bumps BP9 to BP14 may have a size within a range of 1.5 μm±β, where β is a second tolerance value of error. In some embodiments, there is a certain distance between each second bump and the first bump adjacent to the second bump. Here, the so-called adjacent of the first bump to the second bump may mean that the projection of the first bump on the first base substrate is adjacent with the projection of the first bump on the first base substrate in any direction, and the so-called distance between the first bump and the second bump may refer to a shortest distance between an edge of the projections of the first bump on the first base substrate and an edge of the projection of the second bump on the first base substrate. For example, a projection of the second bump BP12 on the first base substrate is adjacent to the projections of the first bumps BP5 and BP6 on the first base substrate in the x-direction, and adjacent to the projections of the first bumps BP1 and BP4 on the first base substrate in the y-direction. The second bump BP12 has substantially identical distances (indicated by d in FIG. 3) to the first bumps BP1, BP4, BP5 and BP6 respectively. The distance d may be in a range of 4 μm±γ, where γ is a third tolerance value of error.

In a case that the reflective layer 12A is a continuous layer, the entire reflective layer 12A may be implemented to have a bump layout as shown in FIG. 3; in a case that the reflective layer 12A includes a plurality of reflective parts insulated from each other, each reflective part may be implemented to have the bump layout as shown in FIG. 3.

Figure 4:
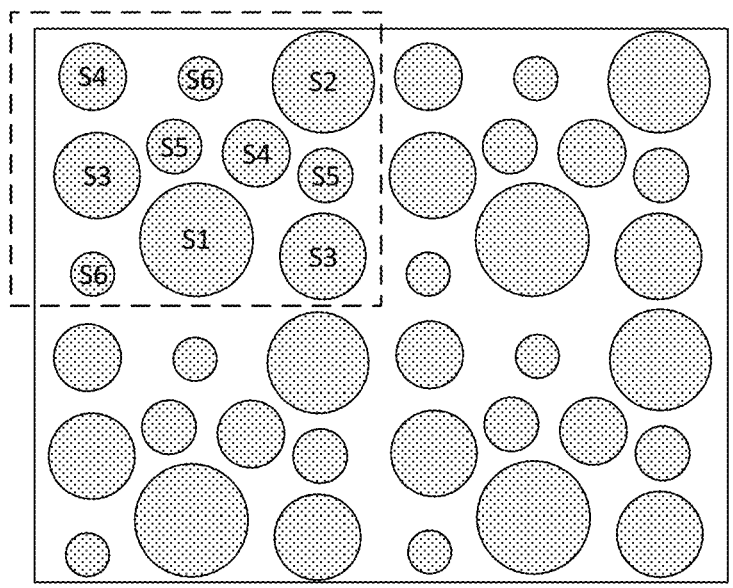
FIG. 4 shows a layout diagram of bumps of the reflective layer according to another embodiment of the present disclosure.

FIG. 4 shows a layout diagram of bumps of the reflective layer according to another embodiment of the present disclosure. A reflective layer 12B in FIG. 4 has a structure similar to that of the reflective layer 12A in FIG. 3 with at least a difference in layout of bumps. For the sake of conciseness, the following will mainly describe the differences in detail. For ease of description, only six bumps S1 to S6 within the dashed frame are marked in FIG. 4.

As shown in FIG. 4, the reflective layer 12B includes a plurality of bumps within a range indicated by the dashed frame, and the plurality of bumps have six sizes S1 to S6. For example, ten bumps are shown in the range of the dashed frame in FIG. 4, including one bump having a size S1, one bump having a size S2, one bump having a size S4, two bumps having a size S3, two bumps having a size S5 and two bumps having a size S6. The ten bumps are randomly distributed, so that any two adjacent bumps have different sizes. Each of the sizes S1 to S6 may be in a range of 13 μm to 18 μm for example, S1=18 μm, S2=17 μm, S3=16 μm, S4=15 μm, S5=14 μm, S6=13 μm. These sizes are allowed to have a certain error, for example, an error in a range of 0 to 8 μm. In this way, the irregularity of the bump layout may be improved. In some embodiments, as shown in FIG. 4, the bumps within the range shown by the dashed frame may act as a bump unit, and a plurality of bump units may be arranged periodically, so as to obtain the bump layout as shown in FIG. 4. In a case that the reflective layer 12B is a continuous layer, the entire reflective layer 12B may be implemented to have the bump layout as shown in FIG. 4; in a case that the reflective layer 12B includes a plurality of reflective parts insulated from each other, each reflective part may be implemented to have the bump layout as shown in FIG. 4.

Figure 5:
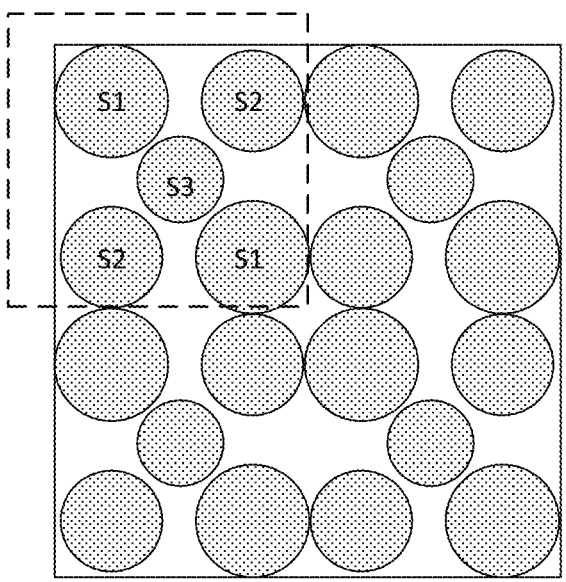
FIG. 5 shows a layout diagram of bumps of the reflective layer according to another embodiment of the present disclosure.

FIG. 5 shows a layout diagram of bumps of the reflective layer according to another embodiment of the present disclosure. A reflective layer 12C in FIG. 5 has a structure similar to that of the reflective layer 12B in FIG. 4 with at least a difference in layout of bumps. For the sake of conciseness, the following will mainly describe the different parts in detail.

As shown in FIG. 5, the reflective layer 12C includes a plurality of bumps having at least three sizes S1 to S3. For example, five bumps are shown in the range of the dashed frame in FIG. 5, including two bumps having the size S1, two bumps having the size S2, and one bump having the size S3. The five bumps are randomly distributed, so that any two adjacent bumps have different sizes. Each of the sizes S1 to S3 may be in a range of 16 μm to 18 μm, for example, S1=18 μm, S2=17 μm, S3=16 μm. These sizes are allowed to have a certain error, for example, an error in a range of 0 to 8 μm. In this way, the irregularity of the bump layout may be improved. In some embodiments, as shown in FIG. 5, the bumps within the range shown by the dashed frame may act as a bump unit, and a plurality of bump units may be arranged periodically, so as to obtain the bump layout as shown in FIG. 5. In a case that the reflective layer 12C is a continuous layer, the entire reflective layer 12C may be implemented to have the bump layout as shown in FIG. 5. In a case that the reflective layer 12C includes a plurality of reflective parts insulated from each other, each reflective part may be implemented to have the bump layout as shown in FIG. 5.

In the embodiments described above, there is a certain distance between the bumps, and the distance may be represented by a shortest distance between the edges of the projections of the bumps on the first base substrate. However, the embodiments of the present disclosure are not limited to this. In some embodiments, adjacent bumps in each bump unit may be in contact with each other, that is, the distance may be zero or substantially zero. The distance between adjacent bumps located in different bump units may also be zero or substantially zero.

In addition, in the embodiments described above, the bump units BU are all arranged in an array, but the embodiments of the present disclosure are not limited to this. The bump units BU may be arranged in other forms as needed, for example, arranged randomly or arranged in a preset pattern.

Figure 6:
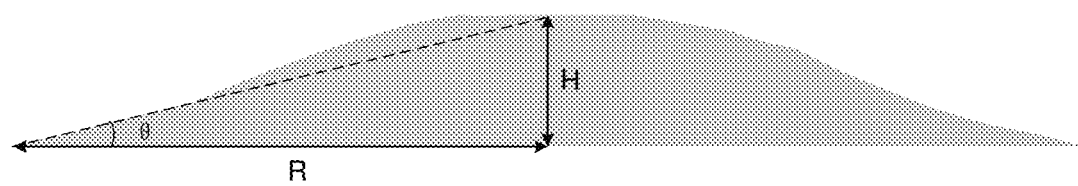
FIG. 6 shows a schematic structural diagram of the bump of the reflective layer according to the embodiments of the present disclosure.

FIG. 6 shows a schematic structural diagram of the bump of the reflective layer according to the embodiments of the present disclosure. The bump structure in FIG. 6 is applicable to any bump in any of the embodiments described above.

As shown in FIG. 6, the bump may have a surface extending smoothly, and the bump may have a height H and a slope θ. The height H may be a distance from a top to a bottom of the bump in a direction perpendicular to the reflective layer. In the embodiments of the present disclosure, the height H of the bump may be in a range of 1.05 μm±δ, where δ is a tolerance value of height error, such as any value in a range of 0 to 0.5 μm. The slope θ of the bump may be defined by the height of the bump and the size of the bump, for example, tan θ=H/R, where R represents one-half of the size of the bump. For example, for the bump corresponding to a circular projection, the size of the bump may include the diameter of the circular projection, and for the bump corresponding to an elliptical projection, the size of the bump may include a length of the major axis of the ellipse projection, a length of the minor axis of the ellipse projection, or an average value of the length of the major axis and the length of the minor axis. In the embodiments of the present disclosure, the slope θ of the bump may be in a range of 6 degrees to 12 degrees, such as 9.5 degrees. This value is allowed to have a certain error, such as an error of 0 to 3 degrees.

Hereinafter, the structure of the display substrate of the embodiments of the present disclosure will be described with reference to FIG. 7A to FIG. 7D.

Figure 7A:
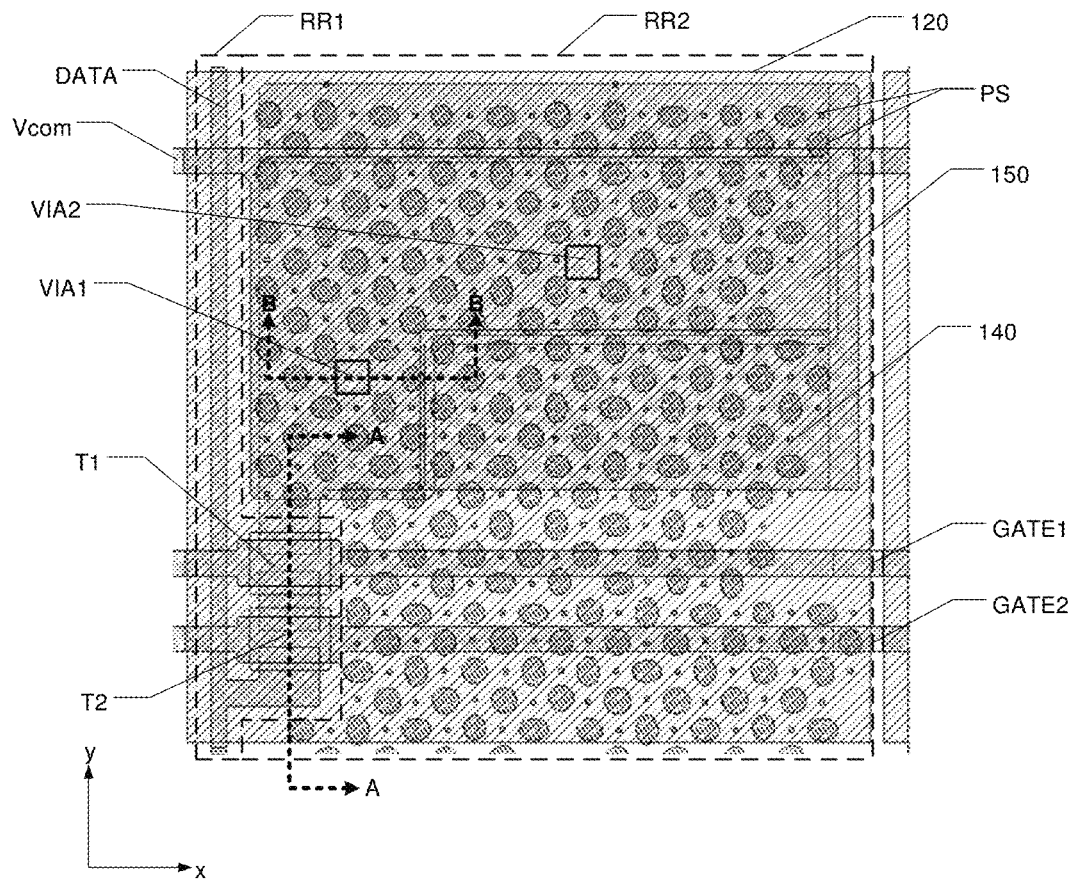
FIG. 7A shows a plan perspective view of a region where the reflective part is located in the display substrate according to an embodiment of the present disclosure.
Figure 7B:
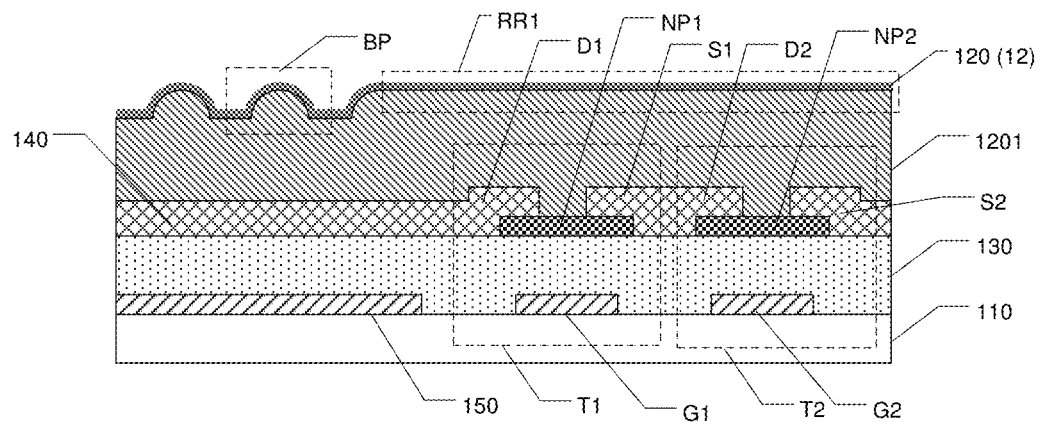
FIG. 7B shows a cross-sectional view of the display substrate of FIG. 7A taken along line AA.
Figure 7C:
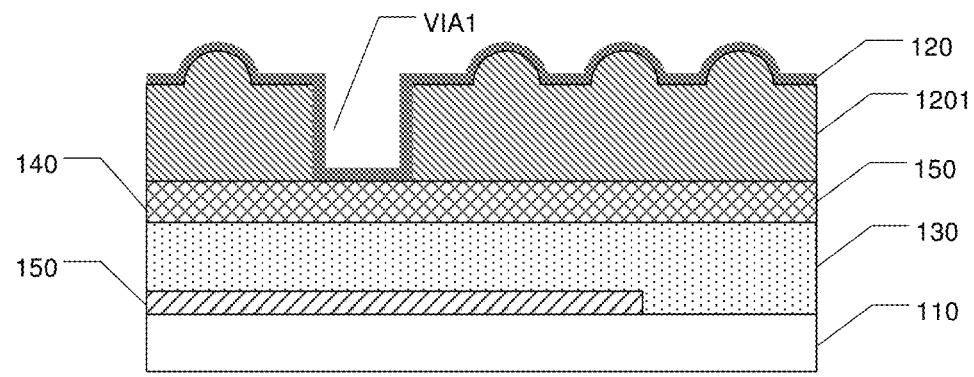
FIG. 7C shows a cross-sectional view of the display substrate of FIG. 7A taken along line BB.

FIG. 7A shows a plan perspective view of a region where the reflective part is located in the display substrate according to an embodiment of the present disclosure. FIG. 7B shows a cross-sectional view of an example of the display substrate of FIG. 7A taken along line AA. FIG. 7C shows a cross-sectional view of an example of the display substrate of FIG. 7A taken along line BB.

As shown in FIG. 7A and FIG. 7B, the sub-pixel region Pxl is provided with a transistor, such as a thin film transistor. In FIG. 7A and FIG. 7B, two transistors, including a first transistor T1 and a second transistor T2, are provided in the sub-pixel region Pxl. The first transistor T1 has a gate electrode G1 electrically connected to a gate line GATE1, a second electrode (for example, a drain electrode) D1 electrically connected to a source/drain layer 140, and a first electrode (for example, a source electrode) S1 electrically connected to a second electrode (for example, a drain electrode) D2 of the second transistor T2. The second transistor T2 has a gate electrode G2 electrically connected to a gate line GATE2, and a first electrode (for example, a source electrode) S2 electrically connected to the data line DATA. The gate lines GATE1 and GATE2 extend in the first direction (x-direction), and the data line DATA extends in the second direction (y-direction) different from the first direction.

The gate electrode G1 of the first transistor T1 and the gate electrode G2 of the second transistor T2 are arranged on the first base substrate 110. An insulating layer 130 is provided on the first base substrate 110 and covers the gate electrodes G1 and G2. The source electrode S1 and the drain electrode D1 of the first transistor T1 and the source electrode S2 and the drain electrode D2 of the second transistor T2 are arranged on a side of the insulating layer 130 away from the first base substrate 110. An active layer NP1 of the first transistor T1 is provided between the source electrode S1 and the drain electrode D1 of the first transistor T1. An active layer NP2 of the second transistor T2 is provided between the source electrode S2 and the drain electrode D2 of the second transistor T2. The gate lines GATE1 and GATE2 are arranged in the same layer as the gate electrode G1 of the first transistor T1 and the gate electrode G2 of the second transistor T2. The data line DATA is arranged in the same layer as the source electrode S1 and the drain electrode D1 of the first transistor T1 and the source electrode S2 and the drain electrode D2 of the second transistor T2.

The reflective layer may be implemented to have the bump layout of any of the embodiments described above. In FIG. 7A, the reflective layer is implemented to have the block structure shown in FIG. 2, which includes a plurality of reflective parts 120. For the sake of conciseness, only one reflective part 120 is shown, and the reflective part 120 is implemented to have the bump layout as shown in FIG. 3. In FIG. 7A, the reflective part 120 is designed such that a projection of the reflective part 120 on the first base substrate has a rectangular shape with a side length in a range of 190 µm to 200 µm. For example, the projection of the reflective part 120 on the first base substrate may be designed as a rectangle with a size of 194 µm×198 µm.

As shown in FIG. 7B, the display substrate may further include an insulating layer 1201 in addition to the reflective layer 12. Since FIG. 7B is taken for one reflective part of the reflective layer, the reference numeral of the reflective layer 12 and the reference numeral of the reflective part 120 refer to the same layer in FIG. 7B. The insulating layer 1201 may be a resin layer, which is arranged on the side of the reflective layer 12 close to the first base substrate 110, and which may cover the source electrodes S1 and S2, the drain electrodes D1 and D2, the active layers NP1 and NP2, and a portion of the insulating layer 130 that is not covered by the source electrodes S1 and S2, the drain electrodes D1 and D2 and the active layers NP1 and NP2. A surface of the insulating layer 1201 away from the first base substrate 110 is formed to include a plurality of bumps. The reflective layer 12 is conformally formed on the surface of the insulating layer 1201 away from the first base substrate, so that the reflective layer 12 is formed to include the first bumps and the second bumps described above. The so-called conformally here may refer to that the reflective layer 12 with a certain thickness is formed on the side of the insulating layer 1201 away from the first base substrate 110, the thickness of the reflective layer 12 at different positions is approximately the same and is less than a certain threshold, and therefore a convex surface consistent with the surface of the insulating layer 1201 may be formed. In some embodiments, the insulating layer 1201 may be a continuous layer, and the plurality of reflective parts 120 are separated from each other. The so-called continuous here may mean that the insulating layer 1201 is an integral structure without separated parts.

The insulating layer 1201 may be formed by a Half Tone process. For example, the structure obtained after forming the transistors T1 and T2 in each sub-pixel region Pxl on the first base substrate 110 may be coated with a photosensitive resin, and then the photosensitive resin is exposed. A mask is used so that different parts of the photosensitive resin receive different doses of light, and the part of the photosensitive resin exposed to light is removed in a subsequent development process, thereby forming a resin layer with bumps on the surface as the insulating layer 1201. In the Half Tone process, a half-exposed region may be additionally designed outside a fully-exposed region (also called a light-transmitting region) and a non-exposed region (also called a light-transmitting region) of a photomask. Because the resin under the half-exposed region receives a light dose less than that received by the resin under the fully-exposed region during the exposure, only part of the surface resin is peeled off during the development. Due to light diffraction and process flexibility, the actual shape formed is a uniform and smooth transitional uneven structure. An epoxy resin may be used as the photosensitive resin, and a coating thickness of the photosensitive resin may be in a range of 1.5 µm to 2.5 µm, such as 2.1 µm. An exposure amount may be in a range of 20 mj to 40 mj, a pre-bake temperature may be in a range of 80° C. to 1100° C., a pre-bake duration may be in a range of 100 s to 140 s, and a development duration may be in a range of 70 s to 100 s.

After the insulating layer 1201 is formed, the reflective layer 12 may be formed on the insulating layer 1201 by a coating process. A material of the reflective layer 12 includes but is not limited to silver, aluminum, silver oxide, or aluminum oxide. A thickness of the reflective layer 12 may be in a range of 0.08 µm to 0.14 µm.

In some embodiments, as shown in FIG. 7A and FIG. 7B, a first common electrode 150 is further provided in the sub-pixel region Pxl. A projection of the first common electrode 150 on the first base substrate 110 at least partially overlaps a projection of the drain electrode D1 on the first base substrate 110, so that the first common electrode 150 and the source/drain layer 140 above the first common electrode 150 form a storage capacitor. The first common electrode 150 is arranged on the first base substrate 110 and is covered by the insulating layer 130. In some embodiments, the display substrate may further include a plurality of common electrode lines, and each common electrode line is connected to the common electrode of at least one row of sub-pixel regions so as to provide a common voltage. As shown in FIG. 7A and FIG. 7B, a common electrode line Vcom extends in the first direction. The common electrode line Vcom is electrically connected to a first common electrode 150 and is arranged in the same layer as the gate electrode G1 of a driving transistor T1 and the gate electrode G2 of a driving transistor T2.

In FIG. 7A and FIG. 7B, a projection of at least a part of transistors T1 and T2 in a sub-pixel region Pxl as well as at least a part of the gate lines GATE1 and GATE2 and at least a part of the data line DATA defining the sub-pixel region Pxl on the first base substrate 110 may be located within the projection of the reflective part 120 corresponding to the sub-pixel region Pxl on the first base substrate 110. In some embodiments, a projection of the first common electrode 150 in a sub-pixel region and at least a part of the common electrode line Vcom on the first base substrate 110 may also be located within the projection of the reflective part 120 corresponding to the sub-pixel region Pxl on the first base substrate 110. In this way, a coverage area of the reflective parts 120 may be as large as possible to improve the reflection effect, and a good electrical isolation between the reflective parts 120 may be achieved.

As shown in FIG. 7A and FIG. 7B, the reflective part 120 may include a first reflective region RR1 and a second reflective region RR2. The first reflective region RR1 has a flat surface, and a surface of the second reflective region RR2 includes the first bumps and the second bumps described above (which are collectively represented by BP in FIG. 7A and FIG. 7B). As shown in FIG. 7B, the surface of the reflective part 120 in the first reflective region RR1 away from the first base substrate 110 is substantially flat. The so-called flat here may be flat as compared with the second reflective region RR2. An average distance from the surface of the reflective part 120 in the second reflective region RR2 away from the first base substrate 110 to the first base substrate 110 is greater than an average distance from the surface of the reflective part 120 in the first reflective region RR1 to the first base substrate 110. In some embodiments, as shown in FIG. 7B, a highest point of the bumps in the second reflective region RR2 may be flush with the surface of the first reflective region RR1.

The projection of at least a part of the transistors T1 and T2 on the first base substrate 110 is located within the projection of the first reflective region RR1 on the first base substrate 110. For example, in FIG. 7A, a projection of the entire second transistor T2 as well as the gate electrode G1 and the source electrode S1 of the first transistor T1 on the first base substrate 110 is located within the projection of the first reflective region RR1 on the first base substrate 110; a projection of a part of the drain electrode D1 of the first transistor T1 on the first base substrate 110 is located within the projection of the first reflective region RR1 on the first base substrate 110. In some embodiments, the projection of at least a part of the data line DATA on the first base substrate 110 may also be located within the projection of the first reflective region RR1 on the first base substrate 110.

Because the reflective part 120 is made of a conductive material, signals on the electrodes of the transistors T1 and T2 may be disturbed if a recessed surface formed between the bumps BP of the reflective part 120 is too close to the transistors T1 and T2 located below. By providing the first reflective region RR1 with a flat surface above the transistors T1 and T2, it is possible to prevent the bumps BP on the reflective part 120 from causing signal interference to the transistors T1 and T2. In addition, compared to the gate line GATA, the data line DATA is closer to the reflective part 120 in the direction perpendicular to the display substrate and there are less intermediate layers, so that a recessed surface between the bumps BP of the reflective part 120 is likely to cause interference to the signal on the data line DATA located below. Such interference may be reduced by arranging the first reflective region RR1 with a flat surface above the data line DATA.

In some embodiments, the insulating layer 1201 may be further provided with via holes, such as via holes VIA1 and VIA2 as shown in FIG. 7A. The reflective part 120 may be electrically connected to the drain electrode D1 of the first transistor T1 through the via holes VIA1 and VIA2. FIG. 7C shows the via hole VIA1 for illustration. As shown in FIG. 7C, the drain electrode D1 of the first transistor T1 is at least partially exposed from the insulating layer 1201 through the via hole VIA1, and the reflective part 120 covers a sidewall of the via hole VIA1 and an exposed portion of the drain electrode D1, so as to achieve an electrical connection with the drain electrode D1 of the first transistor T1. An overlapping of the reflective layer 12 and the drain electrode D1 at the via hole VIA2 is the same as that at the via hole VIA1, which will not be repeated here. By providing two via holes VIA1 and VIA2, in a case that one via hole is damaged, the other via hole may be used.

Figure 7D:
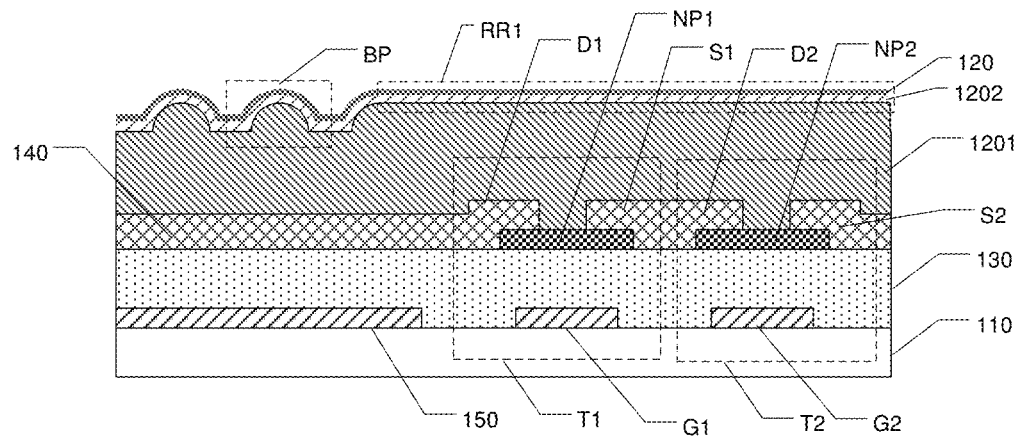
FIG. 7D shows a cross-sectional view of another example of the display substrate of FIG. 7A taken along line AA.

FIG. 7D shows a cross-sectional view of another example of the display substrate of FIG. 7A taken along line AA. FIG. 7D is similar to FIG. 7C, and the difference lies at least in that the display substrate further includes a passivation layer 1202. As shown in FIG. 7D, the passivation layer 1202 is arranged between the insulating layer 1201 and the reflective layer 12. A material of the passivation layer 1202 includes but is not limited to silicon nitride. By providing the passivation layer 1202, peeling of the reflective layer 12 from the insulating layer 120 may be mitigated or avoided. A thickness of the passivation layer 1202 may be as small as possible within a range allowed by the process. For example, the thickness of the passivation layer 1202 may be within a range of 0.1 μm to 0.2 μm, such as 0.15 μm. The passivation layer 1202 corresponding to the plurality of reflective parts 120 may be continuous, and in some embodiments may be provided in form of separated parts. The via holes VIA1 and VIA2 may penetrate the passivation layer 1202 so as to achieve the electrical connection between the reflective part 120 and the source/drain layer 140, which will not be described in detail here.

Figure 7E:
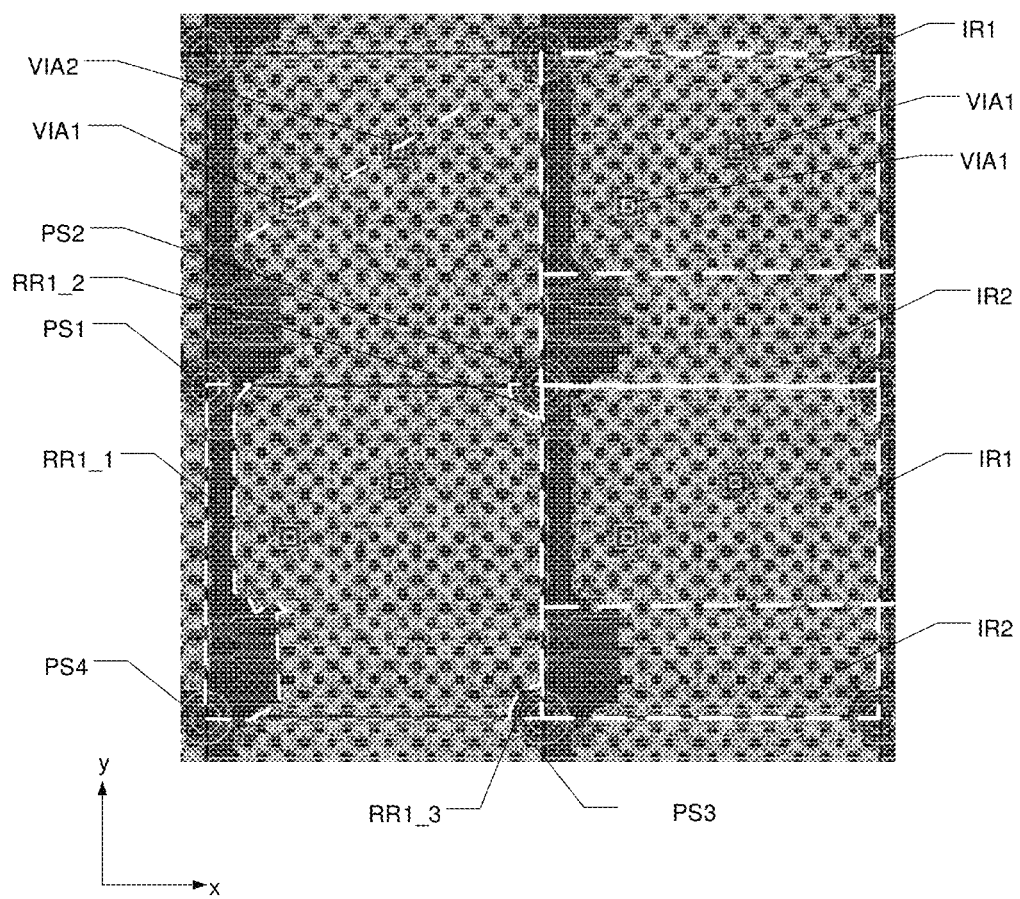
FIG. 7E shows a plan perspective view of the display substrate according to another embodiment of the present disclosure.

FIG. 7E shows a plan perspective view of the display substrate according to another embodiment of the present disclosure, in which an insulating layer structure corresponding to the plurality of sub-pixel regions Pxl is shown. As shown in FIG. 7E, the insulating layer includes a plurality of first insulating regions IR1 and a plurality of second insulating regions IR2 alternately arranged in the second direction (y-direction). As shown in FIG. 7E, a density of bumps in the first insulating region IR1 is greater than a density of bumps in the second insulating region. The so-called density of bumps in the insulating region may refer to a value obtained by dividing a number of the bumps in the insulating region by an area of a projection of the insulating region on the first base substrate. The bumps in the insulating layer 1201 correspond to the first bumps and the second bumps in the reflective layer described above.

As shown in FIG. 7E, the display substrate may further include at least one spacer. For ease of description, only four spacers PS1 to PS4 (hereinafter collectively referred to as PS) are marked. In FIG. 7E, the projection of the first reflective region RR1 of the reflective layer 12 on the first base substrate at least partially overlaps a projection of the spacers PS1 to PS4 on the first base substrate. For example, the first reflective region RR1 includes a first sub-portion RR1_1, a second sub-portion RR1_2 and a third sub-portion RR1_3. A projection of the first sub-portion RR1_1 on the first base substrate partially overlaps a projection of the spacers PS1 and PS4 on the first base substrate, a projection of the second sub-portion RR1_2 on the first base substrate partially overlaps a projection of the spacer PS2 on the first base substrate, and a projection of the third sub-portion RR1_3 on the first base substrate partially overlaps a projection of the spacer PS3 on the first base substrate.

As shown in FIG. 7E, at least two via holes are provided in a region of the insulating layer corresponding to each reflective part. For example, via holes VIA1 and VIA2 are provided in the first insulating region IR1, and the via holes VIA1 and VIA2 are arranged in a fifth direction (as shown by the dashed line in FIG. 7E). An angle of the fifth direction with respect to the first direction (x-direction) is within a range of 15 degrees to 45 degrees.

Figure 8:
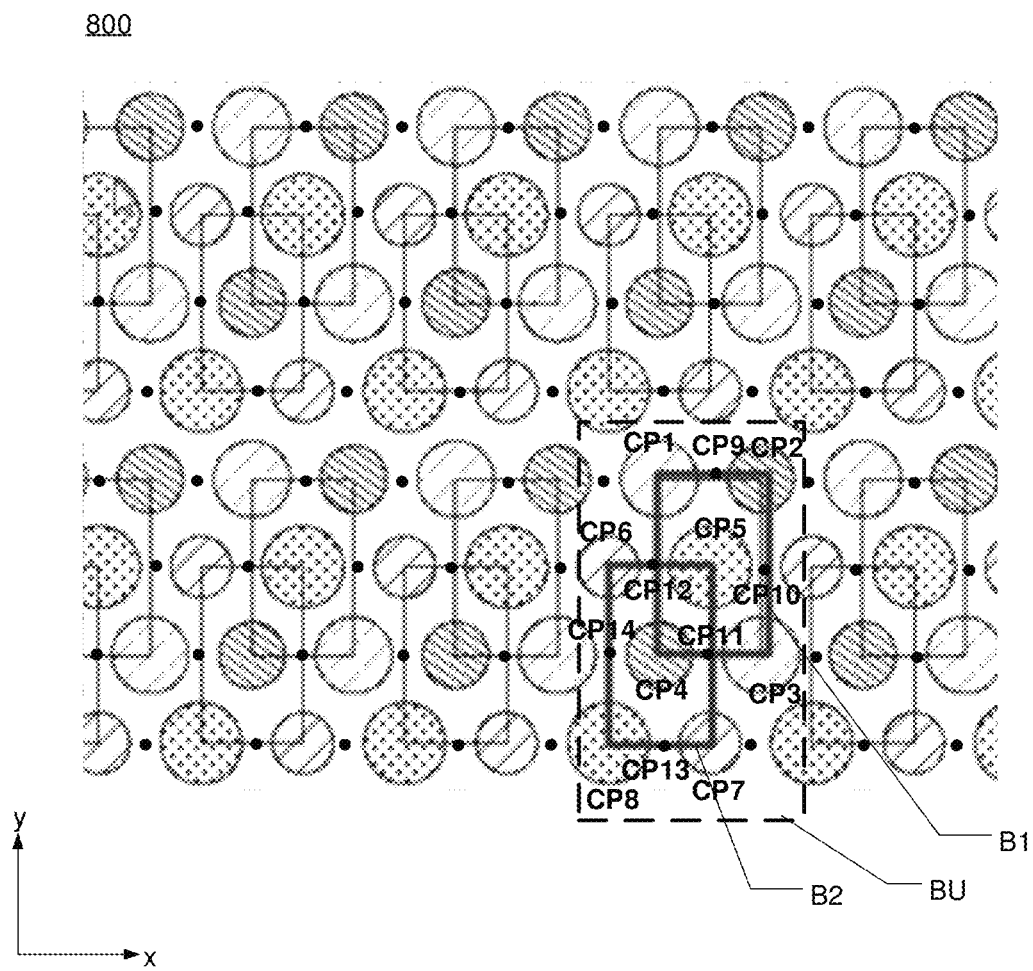
FIG. 8 shows a structural diagram of a mask according to an embodiment of the present disclosure.

FIG. 8 shows a structural diagram of a mask according to an embodiment of the present disclosure.

As shown in FIG. 8, the mask 800 includes a plurality of light-transmitting regions (as shown by the circular regions in FIG. 8, for the convenience of description, only some of the light-transmitting regions CP1 to CP14 are marked) and an opaque region located between the light-transmitting regions (the region other than the circular regions as shown in FIG. 8). The plurality of light-transmitting regions CP1 to CP14 (hereinafter also collectively referred to as light-transmitting regions CP) have at least three sizes, and any two adjacent light-transmitting regions of the plurality of light-transmitting regions CP1 to CP14 have different sizes.

In some embodiments, as shown in FIG. 8, the mask 800 may include a plurality of mask regions BU arranged in an array. In FIG. 8, for the sake of conciseness, only one mask region BU is marked. In some embodiments, distances between adjacent mask regions BU may be equal. Each mask region BU includes a plurality of groups of light-transmitting regions. For example, in FIG. 3, each mask region BU includes a first group of light-transmitting regions and a second group of light-transmitting regions. The first group of light-transmitting regions includes a first light-transmitting region CP1, a second light-transmitting region CP2, a third light-transmitting region CP3, a fourth light-transmitting region CP4 and a fifth light-transmitting region CP5. The second group of light-transmitting regions includes the fourth light-transmitting region CP4, the fifth light-transmitting region CP5, a sixth light-transmitting region CP6, a seventh light-transmitting region CP7 and an eighth light-transmitting region CP8. At least one light-transmitting region is shared by a plurality of groups of light-transmitting regions. For example, the fourth light-transmitting region CP4 and the fifth light-transmitting region BP5 are shared by the first group of light-transmitting regions and the second group of light-transmitting regions in FIG. 8.

At least two light-transmitting regions in each group of light-transmitting regions have different sizes. For example, in FIG. 8, the first light-transmitting region CP1 and the third light-transmitting region CP3 have a first size, the second light-transmitting region CP2 and the fourth light-transmitting region CP4 have a second size, the fifth light-transmitting region CP5 and the eighth light-transmitting region CP8 have a third size, the sixth light-transmitting region CP6 and the seventh light-transmitting region CP7 have a fourth size.

In some embodiments, a projection of each light-transmitting region CP on the first base substrate 110 may have various suitable shapes, including but not limited to a shape of a circle, an ellipse, a polygon, a rectangle, a triangle, and so on. For the light-transmitting region corresponding to a circular projection, the size of the light-transmitting region may be a diameter of the circular projection; for the light-transmitting region corresponding to the elliptical projection, the size of the light-transmitting region may be a length of a major axis of the elliptical projection, a length of a minor axis of the elliptical projection, or an average value of the length of the major axis and the length of the minor axis of the elliptical projection; for the light-transmitting region corresponding to a polygonal, rectangular or triangular projection, the size of the light-transmitting region may be a side length of the polygon, rectangle or triangle. Certainly, the embodiments of the present disclosure are not limited to this, and the size of the light-transmitting region CP may be represented by any shape feature of the projection of the light-transmitting region CP on the first base substrate 110.

In FIG. 3, the projection of each light-transmitting region CP on the first base substrate 110 is a circle, the first size is in a range of 8 μm±α, the second size is in a range of 7 μm±α, the third size is in a range of 9 μm±α, and the fourth size is within a range of 6 μm±α, where α is a first tolerance value of error. The value of α may be set as required, for example, may be set to any value within a range from 0 to 5 μm.

In some embodiments, as shown in FIG. 8, a geometric center of the first light-transmitting region CP1, a geometric center of the second light-transmitting region CP2, a geometric center of the third light-transmitting region CP3 and a geometric center of the fourth light-transmitting region CP4 are arranged to form a first rectangle B1 (as shown by a solid frame in FIG. 8), and a geometric center of the fifth light-transmitting region CP5, a geometric center of the sixth light-transmitting region CP6, a geometric center of the seventh light-transmitting region CP7 and a geometric center of the eighth light-transmitting region CP8 are arranged to form a second rectangle B2 (as shown by the solid frame in FIG. 8).

The first light-transmitting region CP1 is located at a first vertex of the first rectangle B1, the second light-transmitting region CP2 is located at a second vertex of the first rectangle B1, the third light-transmitting region CP3 is located at a third vertex of the first rectangle B1, the fourth light-transmitting region CP4 is located at a fourth vertex of the first rectangle B1, and the fifth light-transmitting region CP5 is located within the first rectangle B1. The first vertex and the third vertex of the first rectangle B1 are diagonal vertices, and the second vertex and the fourth vertex of the first rectangle B1 are diagonal vertices.

The sixth light-transmitting region CP6 is located at a first vertex of the second rectangle B2, the fifth light-transmitting region CP5 is located at a second vertex of the second rectangle B2, the seventh light-transmitting region CP7 is located at a third vertex of the second rectangle B2, the eighth light-transmitting region CP8 is located at a fourth vertex of the second rectangle B2, and the fourth light-transmitting region CP4 is located within the second rectangle B2. The first vertex and the third vertex of the second rectangle B2 are diagonal vertices, and the second vertex and the fourth vertex of the second rectangle B2 are diagonal vertices. A light-transmitting region unit is obtained by arranging the light-transmitting regions of equal size at a set of diagonal vertices of the rectangle and partially overlapping two rectangles in each group of light-transmitting regions, so that any two adjacent light-transmitting regions in the light-transmitting unit have different sizes. The so-called adjacent here may indicate being adjacent in any direction. For example, the light-transmitting regions CP5 and CP7 are adjacent to each other in the y-direction, and the light-transmitting regions CP6 and CP5 are adjacent to each other in the x-direction. For another example, the light-transmitting regions CP5 and CP1 are adjacent to each other in the y'-direction, the light-transmitting regions CP5 and CP2 are adjacent to each other in the x'-direction, and so on.

By arranging the light-transmitting region units into an array and arranging any two adjacent light-transmitting regions in the reflective layer to have different sizes, the irregularity of the layout of the light-transmitting regions of the mask is improved, so that the diffuse reflective of the mask to light may be improved. In addition, since different grating periods and different reflection angles are formed in the light-transmitting regions having different sizes in any direction, color ring phenomenon may be effectively reduced.

In some embodiments, as shown in FIG. 8, the first group of light-transmitting regions may include a ninth light-transmitting region CP9, a tenth light-transmitting region CP10, an eleventh light-transmitting region CP11 and a twelfth light-transmitting region CP12 in addition to the first light-transmitting region CP1 to the fifth light-transmitting region CP5, and the second group of light-transmitting regions may include an eleventh light-transmitting region CP11, a twelfth light-transmitting region CP12, a thirteenth light-transmitting region CP13 and a fourteenth light-transmitting region CP14 in addition to the fourth light-transmitting region CP4 to the eighth light-transmitting region CP8. The ninth light-transmitting region CP9 is located between the first light-transmitting region CP1 and the second light-transmitting region CP2, the tenth light-transmitting region CP10 is located between the second light-transmitting region CP2 and the third light-transmitting region CP3, the eleventh light-transmitting region CP11 is located between the third light-transmitting region CP3 and the fourth light-transmitting region CP4, and the twelfth light-transmitting region CP12 is located between the fourth light-transmitting region CP4 and the first light-transmitting region CP1. The eleventh light-transmitting region CP11 is also located between the fifth light-transmitting region CP5 and the seventh light-transmitting region CP7, the twelfth light-transmitting region CP12 is also located between the fifth light-transmitting region CP5 and the sixth light-transmitting region CP6, the thirteenth light-transmitting region CP13 is located between the seventh light-transmitting region CP7 and the eighth light-transmitting region CP8, and the fourteenth light-transmitting region CP14 is located between the eighth light-transmitting region CP8 and the sixth light-transmitting region CP6.

The projection of each of the ninth light-transmitting region CP9 to the fourteenth light-transmitting region CP14 on the first base substrate 110 is a circle. Each of the ninth light-transmitting region CP9 to the fourteenth light-transmitting region CP14 may have a fifth size. The fifth size may be less than each of the first size, the second size, the third size, and the fourth size. For example, the fifth size may be in a range of 1.5 μm±β, where β is a second tolerance value of error. In FIG. 8, there is a certain distance d between each of the ninth light-transmitting region to the fourteenth light-transmitting region and the adjacent light-transmitting region. The distance d may be in a range of 4 μm±γ, where γ is a third tolerance value of error. The so-called distance d between the light-transmitting regions here may refer to a distance between edges of the light-transmitting regions in a plane where the mask 800 is located. By arranging small-sized light-transmitting regions CP9 to CP14 between the large-sized light-transmitting regions CP1, CP5, CP6, CP11, the light-transmitting regions in the mask 800 are distributed as densely as possible, so that the bumps on the reflective layer formed may be distributed as densely as possible to improve the reflectivity of the reflective layer.

The mask according to the embodiments of the present disclosure may be used to form the reflective layer according to the embodiments of the present disclosure. For example, the mask 800 described above may be used to form the reflective layer shown in FIG. 3, and the light-transmitting regions CP1 to CP14 on the mask correspond to the bumps BP1 to BP14 of the reflective layer one-to-one.

Figure 9:
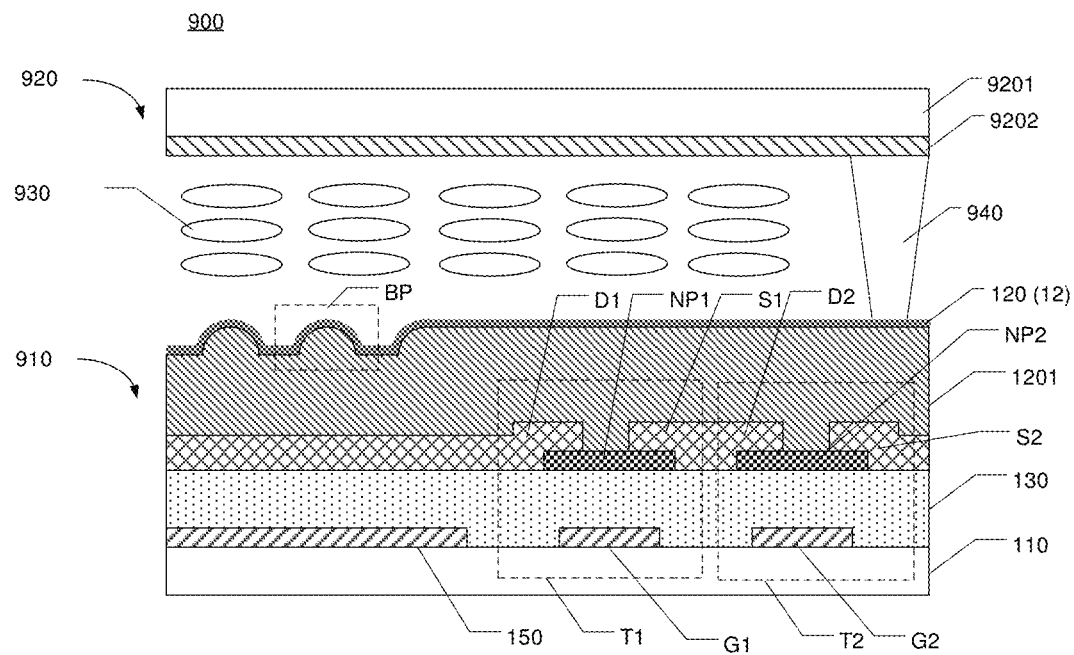
FIG. 9 shows a cross-sectional view of a display panel according to an embodiment of the present disclosure.

FIG. 9 shows a cross-sectional view of a display panel according to an embodiment of the present disclosure.

As shown in FIG. 9, a display panel 900 includes a first substrate 910, a second substrate 920, and a liquid crystal 930 located between the first substrate 910 and the second substrate 920.

The first substrate 910 may be implemented by the display substrate of any of the embodiments described above, for example, the display substrate described above with reference to FIG. 7A to FIG. 7E.

The second substrate 920 includes a second base substrate 9201 and a second common electrode 9202. The second common electrode 9202 is arranged on a side of the second base substrate 9201 facing the first substrate 910. In some embodiments, a spacer PS is provided on a side of the first substrate 910 facing the second substrate 920 to ensure a distance between the first substrate 910 and the second substrate 920.

When the display panel 900 is in operation, a common voltage is applied to the second common electrode 9202, and a data voltage applied to the source electrode S2 of the second transistor T2 is provided to the reflective part 120 through the via hole in the resin layer 1201, so that an electric field for deflecting the liquid crystal 930 is formed between the reflective part 120 and the second common electrode 9202. Since the second substrate 920 is not provided with a color filter layer and a polarizer, the display panel 900 may be configured to perform black and white display. For example, two data voltages may be set for each sub-pixel Pxl. Under a first data voltage, the electric field between the reflective part 120 and the second common electrode 9202 causes the liquid crystal 930 to deflect in a direction parallel to the first substrate 910 and the second substrate 920, so that a transmission of light from the first substrate 910 to the second substrate 920 is blocked, and the sub-pixel Pxl displays black; under a second data voltage, the electric field between the reflective part 120 and the second common electrode 9202 causes the liquid crystal 930 to deflect in a direction perpendicular to the first substrate 910 and the second substrate 920, so that the light reflected by the reflective part 120 completely passes through the liquid crystal 930 and exits from the second substrate 1200, and the sub-pixel Pxl displays white. Certainly, the embodiments of the present disclosure are not limited to this. The first data voltage and the second data voltage may be used interchangeably. For example, in some embodiments, the sub-pixel Pxl may display white under the first data voltage and display black under the second data voltage, which is related to the actual setting of the display panel.

Figure 10A:
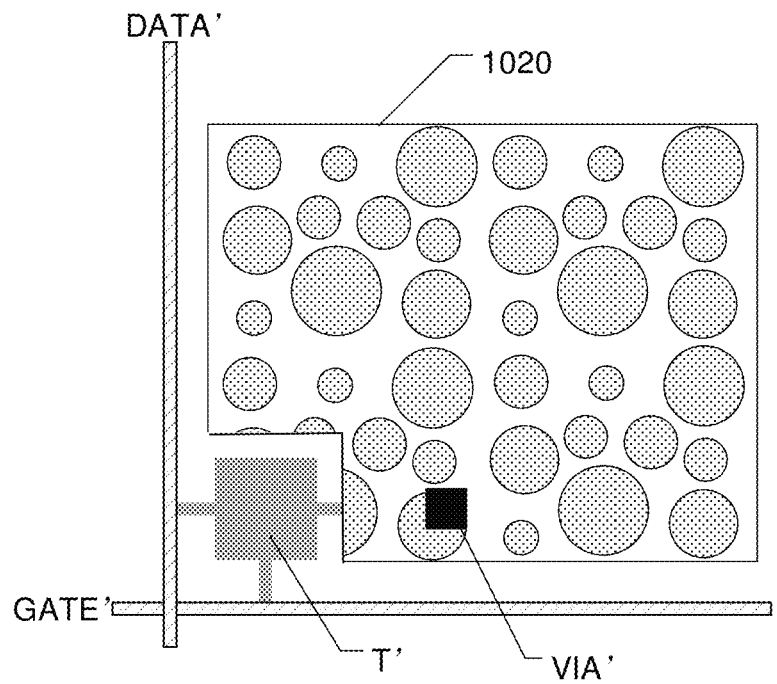
FIG. 10A shows a top view of the region where the reflective part is located in the display substrate according to another embodiment of the present disclosure.
Figure 10B:
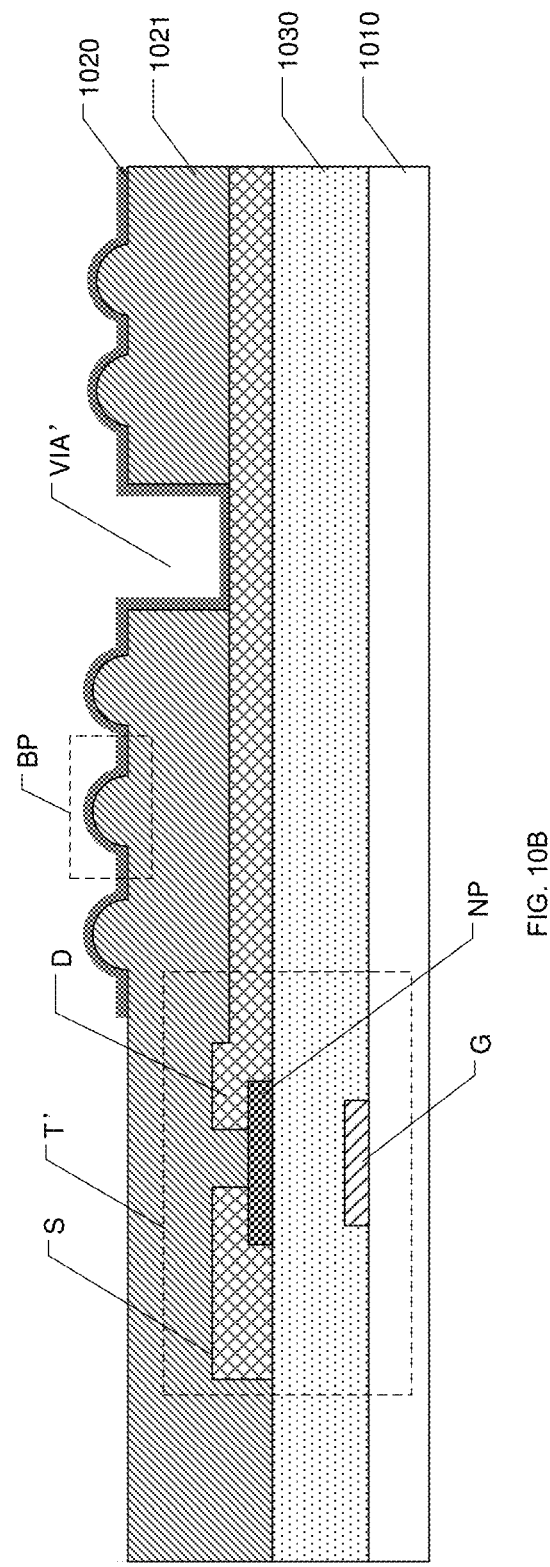
FIG. 10B shows a cross-sectional view of the display substrate of FIG. 10A taken along line CC.

FIG. 10A shows a top view of the region where the reflective part is located in the display substrate according to another embodiment of the present disclosure. FIG. 10B shows a cross-sectional view of the display substrate of FIG. 10A taken along line CC. The display substrate of FIG. 10A and FIG. 10B are similar to that of FIG. 7A to FIG. 7E, and the difference lies at least in the structure of the reflective part, the structure of the sub-pixel region, and the positional relationship between the reflective part and the sub-pixel region. For the sake of conciseness, the following will mainly describe the different parts in detail.

A transistor T' is provided in the sub-pixel region in FIG. 10A and FIG. 10B. For example, the transistor T' may be a thin film transistor. The transistor T' has a gate electrode G electrically connected to a gate line GATE', a source electrode S electrically connected to a data line DATA', and a drain electrode D electrically connected to the reflective part 1020 via a via hole VIA' in the resin layer 1021. The insulating layer 1300 may cover the gate electrode G.

The reflective part 1020 is designed to have an irregular shape, so that each of at least a part of the transistor T' (for example, the gate electrode, the source electrode and a part of the drain electrode of the transistor T') as well as the data line DATA' and the gate line GATE' electrically connected to the transistor T' has a projection on the first base substrate 1010 being located outside the projection of the reflective part 1020 on the first base substrate 1010. In this way, the reflective part 1020 does not shield the transistor T' and the data line DATA' and the gate line GATE' electrically connected to the transistor T', so that a signal interference of the reflective part 1020 to the transistor T' may be reduced.

Figure 11:
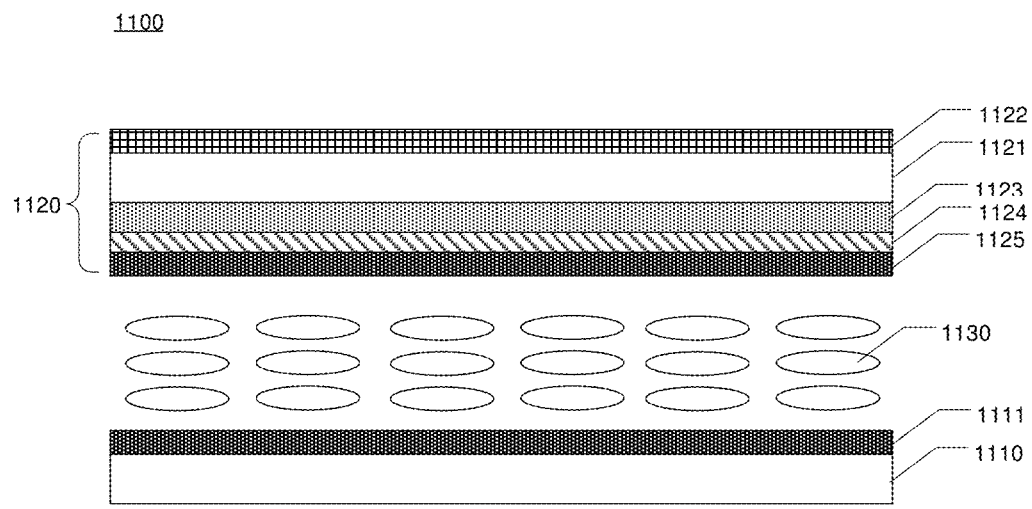
FIG. 11 shows a schematic structural diagram of the display panel according to another embodiment of the present disclosure.

FIG. 11 shows a schematic structural diagram of the display panel according to another embodiment of the present disclosure.

The display panel 1100 includes a first substrate 1110, a second substrate 1120, and a liquid crystal 1130 located between the first substrate 1110 and the second substrate 1120. The first substrate 1110 may be implemented by the display substrate of any of the embodiments described above, such as the display substrate described above with reference to FIG. 7A to FIG. 7E, or the display substrate described above with reference to FIG. 10A and FIG. 10B.

A first alignment layer 1111 is further provided on the side of the first substrate 1110 facing the second substrate 1120. The second substrate 1120 may include a second base substrate 1121, a polarizer 1122, a color filter layer 1123, a second common electrode 1124, and a second alignment layer 1125. The polarizer 1123 is arranged on a side of the second base substrate 1121 away from the first substrate 1110. The color filter layer 1123 is arranged on a side of the second base substrate 1121 facing the first substrate 1110. The second common electrode 1124 is arranged on a side of the color filter layer 1123 facing the first substrate 1110. The second assignment layer 1125 is arranged on a side of the second common electrode 1124 facing the first substrate 1110. The color filter layer 1123 may be provided with a color filter and a black matrix, so as to achieve color display.

Figure 12:
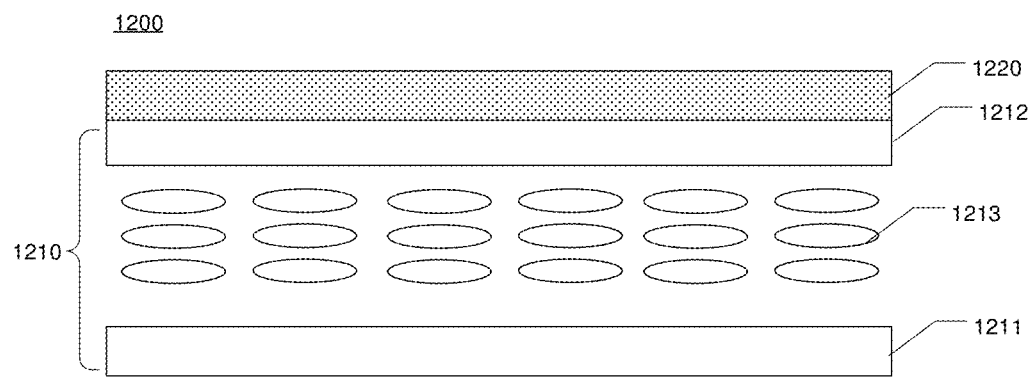
FIG. 12 shows a schematic structural diagram of a display device according to the embodiments of the present disclosure.

FIG. 12 shows a schematic structural diagram of a display device according to the embodiments of the present disclosure.

As shown in FIG. 12, a display device 1200 includes a display panel 1210 and a front light source 1220. In FIG. 12, the display panel 1210 includes a first substrate 1211, a second substrate 1212, and a liquid crystal 1213 located between the first substrate 1211 and the second substrate 1212. The display panel 1210 may be implemented by the display panel of any of the embodiments described above, for example, the display panel described above with reference to FIG. 9 or FIG. 11. The front light source 1220 is arranged on a side of the second substrate 1212 away from the first substrate 1211 and configured to emit light toward the second substrate 1212. The display device 1200 may be implemented as various electronic devices, including but not limited to a smart wearable device, a mobile phone, a computer, an advertising screen, etc. that requires a long standby time.

Figure 13A:
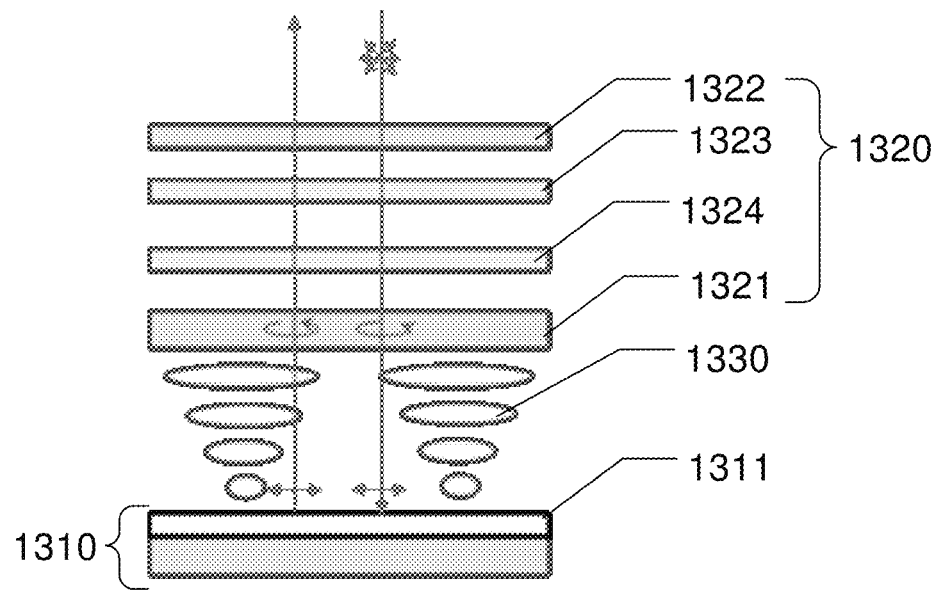
FIG. 13A shows a principle diagram of an optical path of the display panel in a white state according to the embodiments of the present disclosure.
Figure 13B:
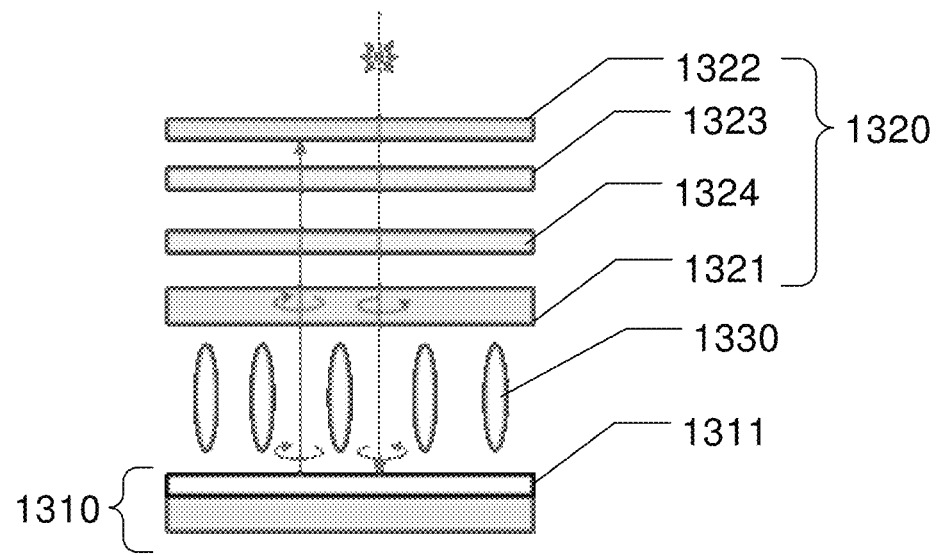
FIG. 13B shows a principle diagram of an optical path of the display device in a black state according to the embodiments of the present disclosure.

FIG. 13A shows a principle diagram of an optical path of the display panel in a black state according to the embodiments of the present disclosure. FIG. 13B shows a principle diagram of an optical path of the display panel in a white state according to the embodiments of the present disclosure. The display panel in FIG. 13A and FIG. 13B may be implemented by the display panel of any of the embodiments described above, and may include a first substrate 1310, a second substrate 1320, and a liquid crystal 1330 located between the two. The second substrate 1320 may be implemented as similar to the second substrate 1120 described above with reference to FIG. 11, and a first retardation sheet 1323 and a second retardation sheet 1324 are further provided between the second base substrate 1321 and the polarizer 1322 of the second substrate 1320. The first retardation sheet 1323 may be a $\lambda/2$ retardation sheet, and the second retardation sheet 1324 may be a $\lambda/4$ retardation sheet, where $\lambda$ represents a wavelength of light.

The sub-pixels of the display panel may have a white state, a black state, and a gray scale state between the white state and the black state. The deflection of the liquid crystal 1330 is controlled by applying a voltage to the liquid crystal 1330, so as to achieve various display states.

As shown in FIG. 13A, when a zero electric field is applied to the liquid crystal 1330, that is, when the first voltage is applied to the liquid crystal 1330, ambient light passes through the polarizer 1322 and then turns into linearly polarized light. After the linearly polarized light passes through the $\lambda/2$ retardation sheet 1323, a polarization direction of the linearly polarized light is offset by a certain angle (but still linearly polarized), and after passing through the $\lambda/4$ retardation sheet 1324, the linearly polarized light becomes circularly polarized light (for example, right-handed). In this case, the liquid crystal 1330 shown in FIG. 13A may be equivalent to a $\lambda/4$ retardation sheet 1324, and the circularly polarized light becomes linearly polarized light after passing through the liquid crystal 1330. The linearly polarized light is still linearly polarized after being reflected by the reflective layer 1311, but the polarization direction changes. The polarized light becomes circularly polarized light (right-handed) after passing through the liquid crystal 1330, and then becomes linearly polarized light after passing through the $\lambda/4$ retardation sheet 1324 and the $\lambda/2$ retardation sheet 1323 in turn, and the polarization direction is consistent with a transmission axis of the polarizer 1322, so that a bright state is achieved.

As shown in FIG. 13B, when the liquid crystal 1330 is energized, that is, when the second voltage is applied to the liquid crystal 1330, a major axis of liquid crystal molecules is parallel to a light propagation direction, and the light does not undergo birefringence when passing through the liquid crystal 1330. Firstly, the ambient light becomes linearly polarized light after passing through the polarizer 1322. After the linearly polarized light passes through the $\lambda/2$ retardation sheet 1323, the polarization direction of the linearly polarized light is offset by a certain angle (but still linearly polarized), and after passing through the $\lambda/4$ retardation sheet 1324, the linearly polarized light becomes circularly polarized light (for example, right-handed). After the right-handed circularly polarized light is reflected by the reflective layer 1311, a direction of rotation is reversed, that is, the right-handed circularly polarized light becomes left-handed after being reflected by the metal reflective layer 1311, and becomes linearly polarized light after passing through the $\lambda/4$ retardation sheet 1324 and $\lambda/2$ retardation sheet 1323, but the polarization direction is perpendicular to the transmission axis of the upper polarizer, so that the light cannot be emitted, and a dark state appears.

Those skilled in the art may understand that the embodiments described above are exemplary, and those skilled in the art may make improvements. The structures described in the embodiments may be combined freely without conflicts in structure or principle.

After describing the preferred embodiments of the present disclosure in detail, those skilled in the art may clearly understand that various changes and modifications may be made without departing from the scope and spirit of the appended claims, and the present disclosure is not limited to implementations of the exemplary embodiments described in the present disclosure.

What is claimed is:

1. A display substrate, comprising:
a first base substrate, wherein a plurality of sub-pixel regions arranged in an array are provided on the first base substrate;
a reflective layer provided on one side of the first base substrate, wherein a surface of the reflective layer away from the first base substrate is formed to comprise a plurality of first bumps and a plurality of second bumps, and the first bumps have a size greater than that of the second bumps; and
an insulating layer provided on a side of the reflective layer facing the first base substrate, wherein a surface of the insulating layer away from the first base substrate is formed to comprise a plurality of insulating bumps, and the reflective layer is conformally formed on a side of the insulating layer away from the first base substrate, so that the reflective layer is formed to comprise the plurality of first bumps and the plurality of second bumps;
wherein in each sub-pixel region, at least one pixel electrode is provided, the reflective layer is formed of a conductive material, the reflective layer comprises a plurality of reflective parts insulated from each other, and at least one of the plurality of reflective parts is multiplexed as the pixel electrode in one of the plurality of sub-pixel regions;
wherein in each sub-pixel region, at least one transistor connected to the pixel electrode is further provided, the transistor comprises a gate electrode, a first electrode and a second electrode, and the second electrode is electrically connected to the reflective part multiplexed as the pixel electrode in the sub-pixel region;
wherein a via hole is provided in the insulating layer, and the reflective part is electrically connected to the second electrode of the transistor through the via hole; and
wherein each reflective part is electrically connected to the second electrode of the transistor in the sub-pixel region through at least two via holes arranged in a fifth direction, and an angle of the fifth direction with respect to the first direction is within a range of 15 degrees to 45 degrees.

2. The display substrate of claim 1, wherein the plurality of first bumps and the plurality of second bumps are alternately arranged in at least one of a first direction and a second direction, the size of the first bumps is 4 to 6 times the size of the second bumps, the first direction is a row direction of the array, and the second direction is a column direction of the array.

3. The display substrate of claim 2,
wherein the plurality of first bumps are arranged in a third direction, and at least two adjacent first bumps in the third direction have different sizes; and/or
wherein the plurality of first bumps are arranged in a fourth direction, and at least two adjacent first bumps in the fourth direction have different sizes, wherein any two of the first direction, the second direction, the third direction and the fourth direction intersect each other, an angle of the third direction with respect to the first direction is in a range of 30 degrees to 50 degrees, and the fourth direction is substantially perpendicular to the third direction.

4. The display substrate of claim 2,
wherein the plurality of first bumps are arranged in a third direction, and at least two adjacent first bumps in the third direction have different sizes; or
wherein the plurality of first bumps are arranged in a fourth direction, and at least two adjacent first bumps in the fourth direction have different sizes, wherein any two of the first direction, the second direction, the third direction and the fourth direction intersect each other, an angle of the third direction with respect to the first direction is in a range of 30 degrees to 50 degrees, and the fourth direction is substantially perpendicular to the third direction.

5. The display substrate of claim 1, wherein each of the first bump and the second bump has a height within a range of 1.05 µm±δ, the height is a distance between a top of the bump and a bottom of the bump, and δ is a tolerance value of the height error; and
wherein each of the first bump and the second bump has a slope within a range of 6 degrees to 12 degrees.

6. The display substrate of claim 1, wherein each sub-pixel region is provided with at least one pixel electrode, the reflective layer is located on a side of the pixel electrode away from the first base substrate or a side of the pixel electrode close to the first base substrate, the reflective layer is a continuous layer, and a projection of the reflective layer on the first base substrate covers projections of the pixel electrodes in the plurality of sub-pixel regions on the first base substrate.

7. The display substrate of claim 1, wherein the insulating layer is a continuous layer; and
wherein the insulating layer is a resin layer.

8. The display substrate of claim 7, wherein the insulating layer comprises a plurality of first insulating regions and a plurality of second insulating regions, the plurality of first insulating regions and the plurality of second insulating regions are alternately arranged in the second direction, a density of the insulating bumps in the first insulating region is greater than a density of the insulating bumps in the second insulating region, and the second direction is the column direction of the array.

9. The display substrate of claim 1, further comprising:
a passivation layer provided on the side of the insulating layer away from the first base substrate;
wherein the passivation layer is made of silicon nitride and has a thickness within a range of 0.1 µm to 0.2 µm.

10. The display substrate of claim 1, further comprising:
a plurality of gate lines extending in the first direction, wherein the plurality of gate lines are arranged in the same layer as the gate electrode of the transistor, each gate line is electrically connected to the gate electrodes of the transistors in at least one row of sub-pixel regions in the array, and the first direction is the row direction of the array; and
a plurality of data lines extending in the second direction, wherein the plurality of data lines are arranged in the same layer as the first electrode and the second electrode of the transistor, each data line is electrically connected to the first electrodes of the transistors in at least one column of sub-pixel regions in the array, and the second direction is the column direction of the array;

wherein the plurality of gate lines and the plurality of data lines intersect to define the plurality of sub-pixel regions; each of the transistor in at least one sub-pixel region, at least a part of the gate line electrically connected to the transistor in the sub-pixel region, and at least a part of the data line electrically connected to the transistor in the sub-pixel region has a projection on the first base substrate being located within a projection of the reflective part electrically connected to the transistor in the sub-pixel region on the first base substrate.

11. The display substrate of claim 1, wherein,
in each sub-pixel region a first common electrode is further provided;
the display substrate further comprises a plurality of common electrode lines extending in the first direction and arranged in the same layer as the gate electrode of the transistor, and at least one common electrode line is electrically connected to the first common electrodes in at least one row of sub-pixel regions in the array; and
each of the first common electrode in each sub-pixel region and at least a part of the common electrode line electrically connected to the first common electrode has a projection on the first base substrate being located within a projection of the reflective part multiplexed as the pixel electrode in the sub-pixel region on the first base substrate.

12. The display substrate of claim 1, wherein the reflective part comprises a first reflective region and a second reflective region, and the reflective part has a surface being flat in the first reflective region and comprising the first bumps and the second bumps in the second reflective region;
wherein a projection of the first reflective region on the first base substrate covers a projection of at least a part of the transistor on the first base substrate; and
wherein the display substrate further comprises at least one spacer, wherein a projection of the first reflective region on the first base substrate at least partially overlaps a projection of the spacer on the first base substrate.

13. The display substrate of claim 1, wherein a projection of each of the first bumps and the second bumps on the first base substrate has a shape of a circle or ellipse.

14. The display substrate of claim 1,
wherein the reflective layer further comprises a third bump, a fourth bump, a fifth bump and a sixth bump randomly arranged and having different sizes with each other, and each of the first bump, the second bump, the third bump, the fourth bump, the fifth bump and the sixth bump has a size within a range of 13 μm to 18 μm; or
wherein the reflective layer further comprises a third bump, the first bump, the second bump and the third bump are randomly arranged and have different sizes with each other, and each of the first bump, the second bump and the third bump has a size within a range of 16 μm to 18 μm.

15. A display panel, comprising a first substrate, a second substrate, and a liquid crystal located between the first substrate and the second substrate, wherein the first substrate is implemented by the display substrate of claim 1.

16. The display panel of claim 15, wherein the second substrate comprises:

a second base substrate; and
a second common electrode arranged on a side of the second base substrate facing the first substrate;
wherein a first alignment layer is further provided on a side of the first substrate facing the second substrate, and the second substrate further comprises:
a polarizer provided on a side of the second base substrate away from the first substrate;
a color filter layer provided on a side of the second base substrate facing the first substrate;
a second common electrode provided on a side of the color filter layer facing the first substrate; and
a second alignment layer provided on a side of the second common electrode facing the first substrate.

17. A display device, comprising:
the display panel of claim 15; and
a front light source provided on a side of the second substrate of the display panel away from the first substrate and configured to emit light toward the second substrate.

18. A mask comprising a plurality of light-transmitting regions and an opaque region located between the light-transmitting regions, wherein the plurality of light-transmitting regions have at least three sizes;
wherein the mask comprises a plurality of mask regions arranged in an array, wherein each mask region comprises a first group of light-transmitting regions and a second group of light-transmitting regions;
wherein the first group of light-transmitting regions comprises a first light-transmitting region, a second light-transmitting region, a third light-transmitting region, a fourth light-transmitting region and a fifth light-transmitting region, each of the first light-transmitting region and the third light-transmitting region has a first size, each of the second light-transmitting region and the fourth light-transmitting region has a second size, and the fifth light-transmitting region has a third size; and
wherein the second group of light-emitting regions comprises the fourth light-transmitting region, the fifth light-transmitting region, a sixth light-transmitting region, a seventh light-transmitting region and an eighth light-transmitting region, each of the sixth light-transmitting region and the seventh light-transmitting region has a fourth size, and the eighth light-transmitting region has the third size;
wherein a geometric center of the first light-transmitting region, a geometric center of the second light-transmitting region, a geometric center of the third light-transmitting region and a geometric center of the fourth light-transmitting region are arranged to form a first rectangle, the first light-transmitting region is located at a first vertex of the first rectangle, the second light-transmitting region is located at a second vertex of the first rectangle, the third light-transmitting region is located at a third vertex of the first rectangle, the fourth light-transmitting region is located at a fourth vertex of the first rectangle, and the fifth light-transmitting region is located within the first rectangle, wherein the first vertex and the third vertex of the first rectangle are diagonal vertices, and the second vertex and the fourth vertex of the first rectangle are diagonal vertices; and
wherein a geometric center of the fifth light-transmitting region, a geometric center of the sixth light-transmitting region, a geometric center of the seventh light-transmitting region and a geometric center of the eighth light-transmitting region are arranged to form a second rectangle, the sixth light-transmitting region is located at a first vertex of the second rectangle, the fifth light-transmitting region is located at a second vertex of the second rectangle, the seventh light-transmitting region is located at a third vertex of the second rectangle, the eighth light-transmitting region is located at a fourth vertex of the second rectangle, and the fourth light-transmitting region is located within the second rectangle, wherein the first vertex and the third vertex of the second rectangle are diagonal vertices, and the second vertex and the fourth vertex of the second rectangle are diagonal vertices.

19. The mask of claim 18, wherein:

the first group of light-transmitting regions further comprises a ninth light-transmitting region, a tenth light-transmitting region, an eleventh light-transmitting region and a twelfth light-transmitting region, the ninth light-transmitting region is located between the first light-transmitting region and the second light-transmitting region, the tenth light-transmitting region is located between the second light-transmitting region and the third light-transmitting region, the eleventh light-transmitting region is located between the third light-transmitting region and the fourth light-transmitting region, and the twelfth light-transmitting region is located between the fourth light-transmitting region and the first light-transmitting region;

the second group of light-transmitting regions further comprises the eleventh light-transmitting region, the twelfth light-transmitting region, a thirteenth light-transmitting region and a fourteenth light-transmitting region, the eleventh light-transmitting region is located between the fifth light-transmitting region and the seventh light-transmitting region, the twelfth light-transmitting region is located between the fifth light-transmitting region and the sixth light-transmitting region, the thirteenth light-transmitting region is located between the seventh light-transmitting region and the eighth light-transmitting region, the fourteenth light-transmitting region is located between the eighth light-transmitting region and the sixth light-transmitting region; and each of the ninth light-transmitting region, the tenth light-transmitting region, the eleventh light-transmitting region, the twelfth light-transmitting region, the thirteenth light-transmitting region and the fourteenth light-transmitting region has a fifth size less than each of the first size, the second size, the third size and the fourth size.

* * * * *